United States Patent
Lu et al.

(10) Patent No.: US 10,665,313 B1
(45) Date of Patent: May 26, 2020

(54) DETECTING SHORT CIRCUIT BETWEEN WORD LINE AND SOURCE LINE IN MEMORY DEVICE AND RECOVERY METHOD

(71) Applicant: SanDisk Technologies LLC, Addison, TX (US)

(72) Inventors: Ching-Huang Lu, Fremont, CA (US); Henry Chin, Fremont, CA (US); Jian Chen, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/402,151

(22) Filed: May 2, 2019

(51) Int. Cl.
| | |
|---|---|
| G11C 29/00 | (2006.01) |
| G11C 29/02 | (2006.01) |
| G11C 16/14 | (2006.01) |
| G11C 16/26 | (2006.01) |
| G11C 16/04 | (2006.01) |
| G11C 29/38 | (2006.01) |
| G11C 16/34 | (2006.01) |
| G11C 29/12 | (2006.01) |

(52) U.S. Cl.
CPC .......... *G11C 29/02* (2013.01); *G11C 16/0483* (2013.01); *G11C 16/14* (2013.01); *G11C 16/26* (2013.01); *G11C 16/3459* (2013.01); *G11C 29/38* (2013.01); *G11C 2029/1202* (2013.01); *G11C 2029/1204* (2013.01)

(58) Field of Classification Search
CPC ............ G11C 16/16; G11C 2029/1202; G11C 29/025; G11C 29/44
See application file for complete search history.

(56) References Cited

U.S. PATENT DOCUMENTS

| | | | |
|---|---|---|---|
| 9,330,783 B1 | 5/2016 | Rotbard et al. | |
| 9,355,735 B1 | 5/2016 | Chen et al. | |
| 9,378,795 B1 * | 6/2016 | DeBrosse | G11C 11/1673 |
| 9,484,086 B2 | 11/2016 | Magia et al. | |
| 9,785,493 B1 | 10/2017 | Zhang et al. | |
| 2005/0027084 A1 | 2/2005 | Clarke et al. | |
| 2005/0088878 A1* | 4/2005 | Eshel | G11C 16/28 365/185.28 |
| 2010/0014343 A1* | 1/2010 | Wei | G11C 13/0069 365/148 |
| 2012/0069633 A1* | 3/2012 | Katoh | G11C 13/004 365/148 |

(Continued)

OTHER PUBLICATIONS

International Search Report & The Written Opinion of the International Searching Authority dated Apr. 6, 2020, International Application No. PCT/US2019/067008.

*Primary Examiner* — Tuan T Nguyen
(74) *Attorney, Agent, or Firm* — Vierra Magen Marcus LLP

(57) ABSTRACT

Techniques are described for detecting a short circuit between a word line and a source line in a memory device, and to a method for recovering from such a short circuit. In one aspect, the short circuit is detected in a program operation when a selected word line completes programming after an unusually low number of program loops. A further check is performed to confirm that there is a short circuit. The short circuited word line is then erased and a recovery read is performed for previously-programmed word lines. In another aspect, a short circuit is detected in a read operation.

20 Claims, 24 Drawing Sheets

(56) References Cited

U.S. PATENT DOCUMENTS

| | | | |
|---|---|---|---|
| 2013/0279251 A1* | 10/2013 | Lee | G11C 16/26 |
| | | | 365/185.03 |
| 2015/0179251 A1* | 6/2015 | Yoshimoto | G11C 13/0023 |
| | | | 365/148 |
| 2016/0012914 A1 | 1/2016 | Magia et al. | |
| 2016/0260495 A1* | 9/2016 | Paudel | G11C 16/3427 |
| 2018/0277209 A1* | 9/2018 | Lam | G11C 13/0026 |

* cited by examiner

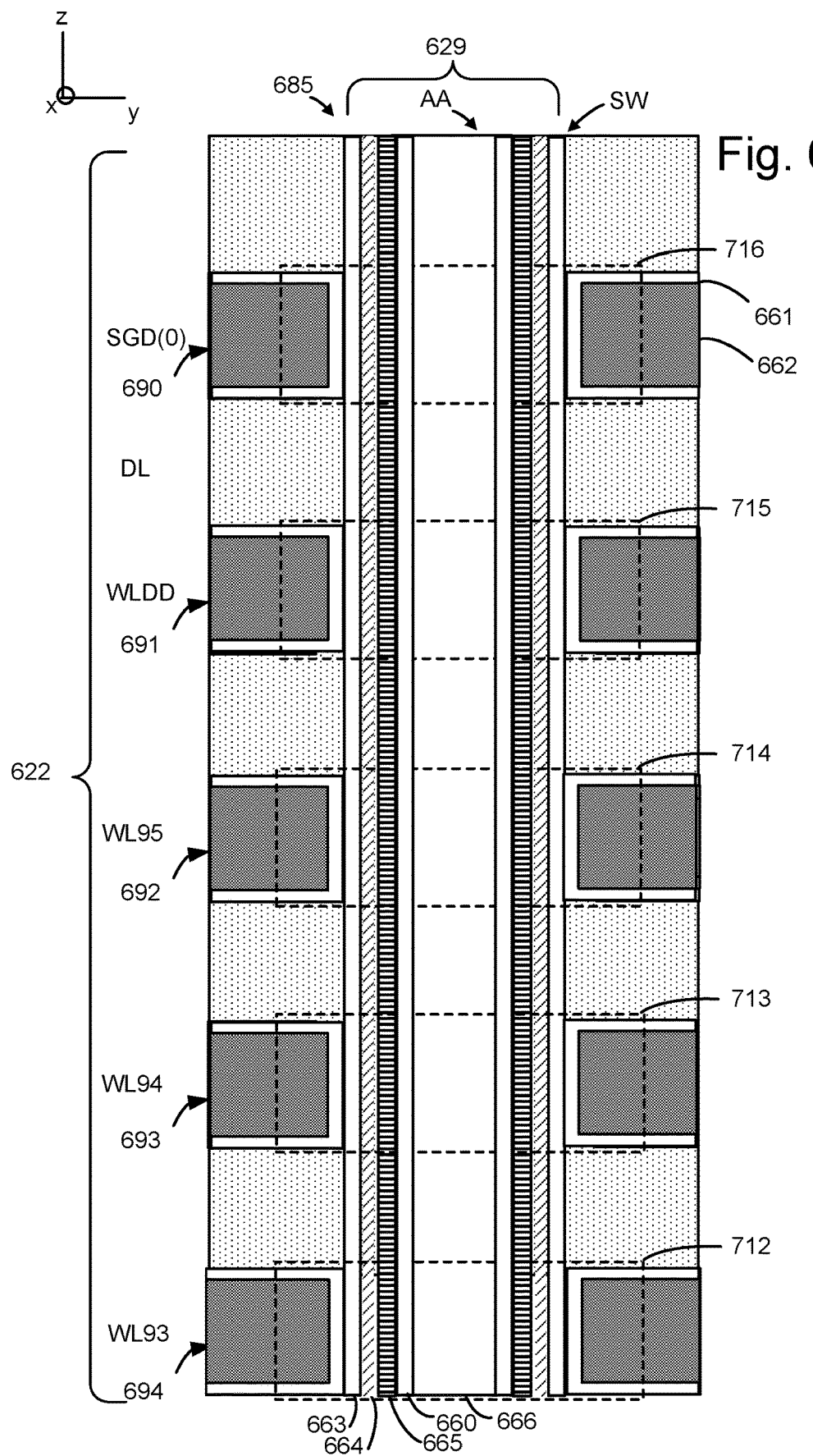

Fig. 7A

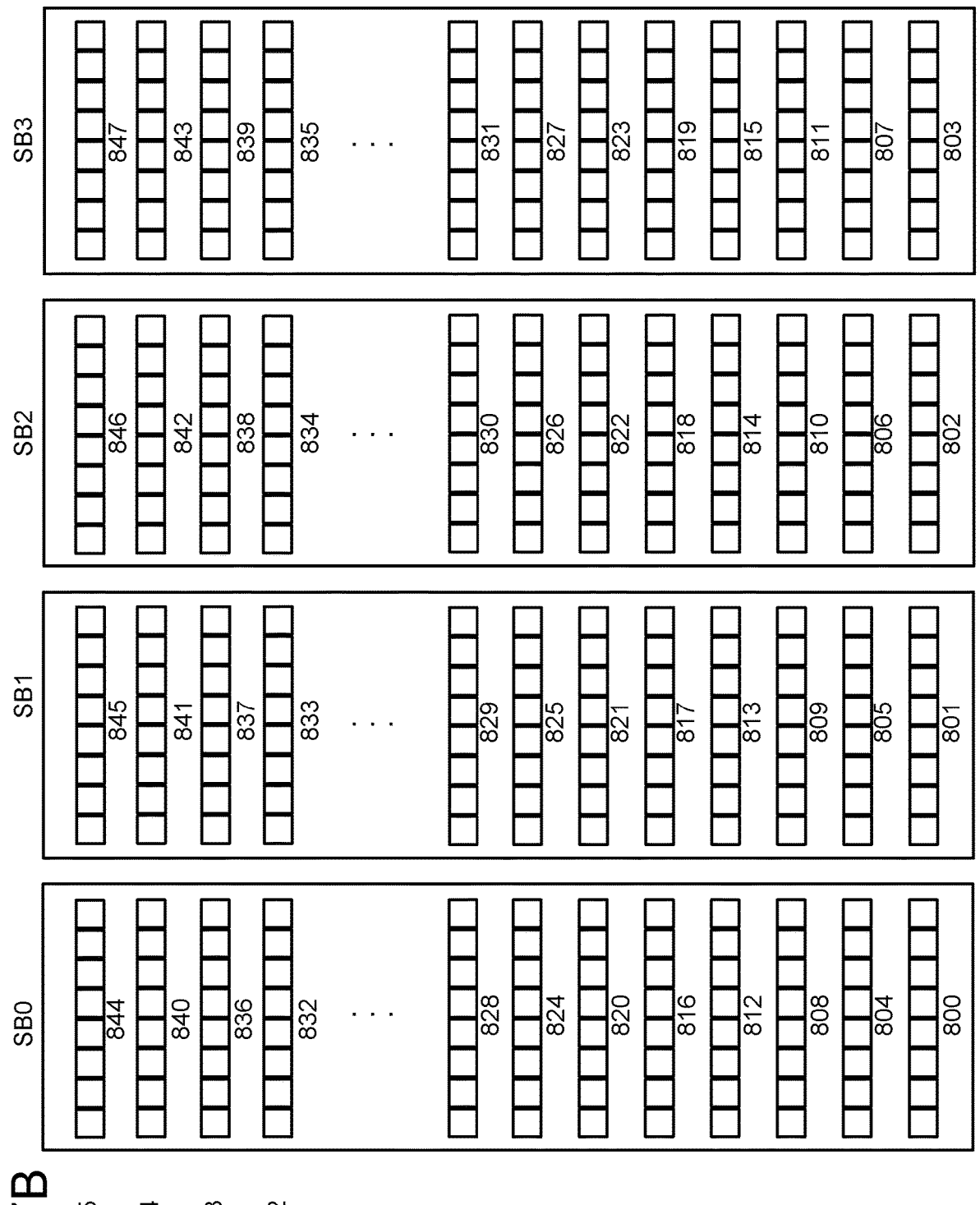

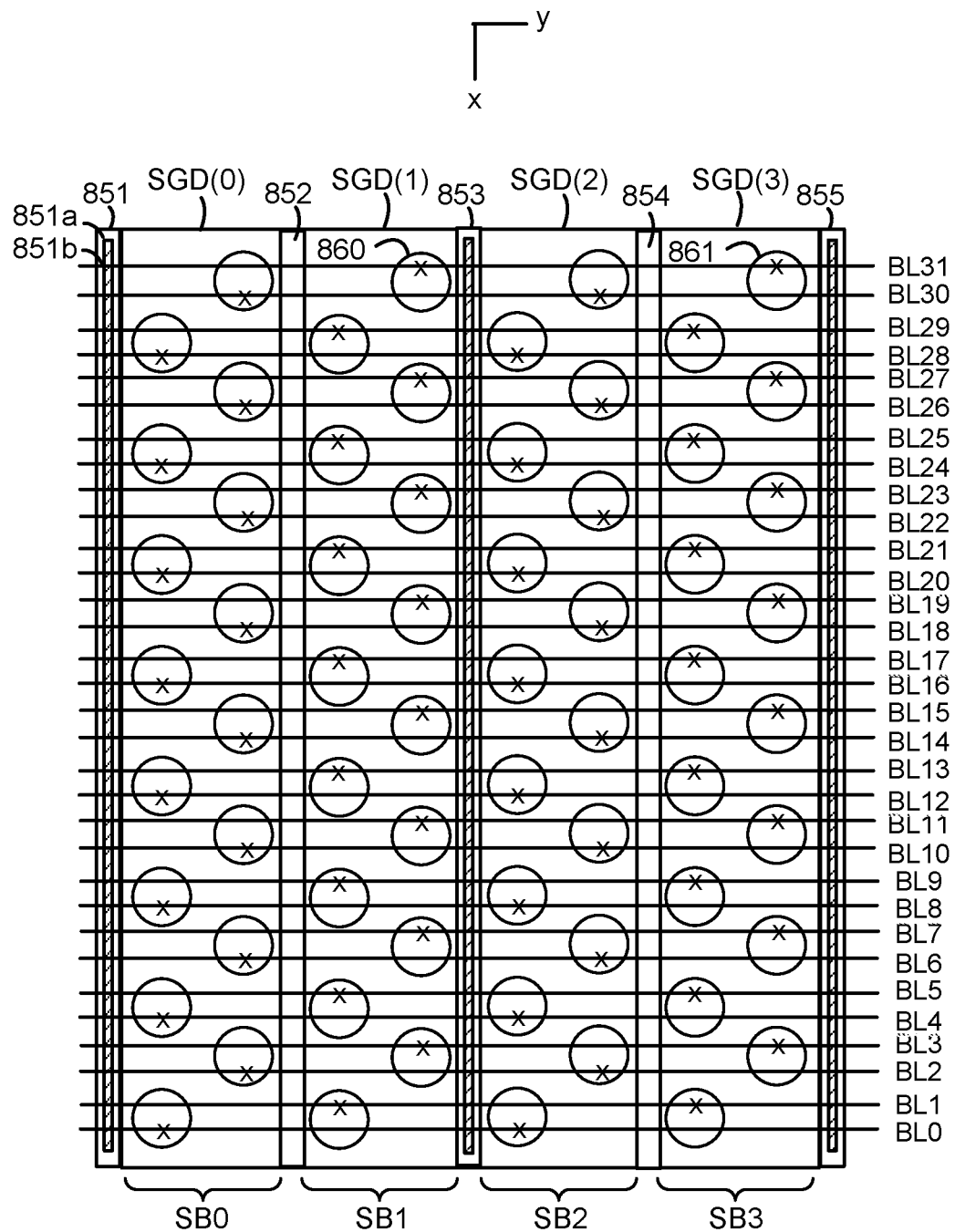

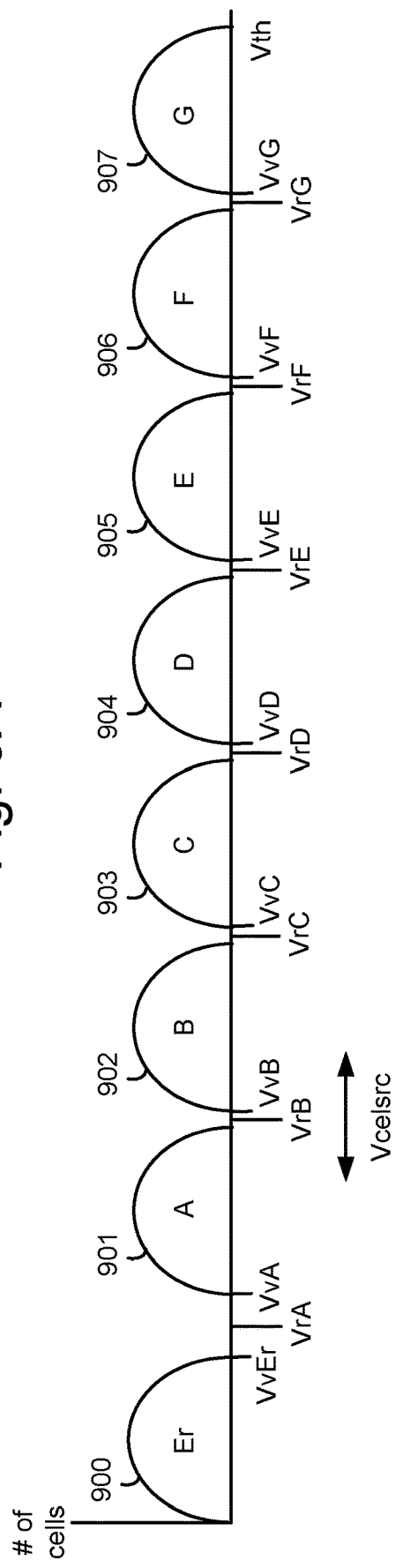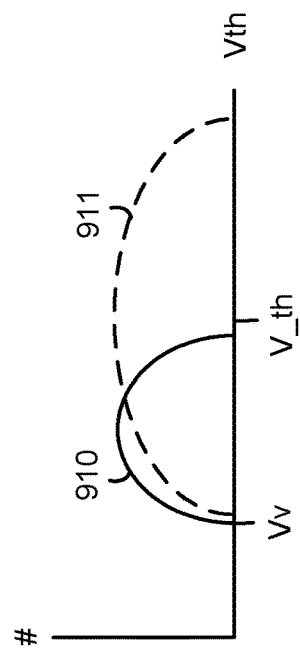

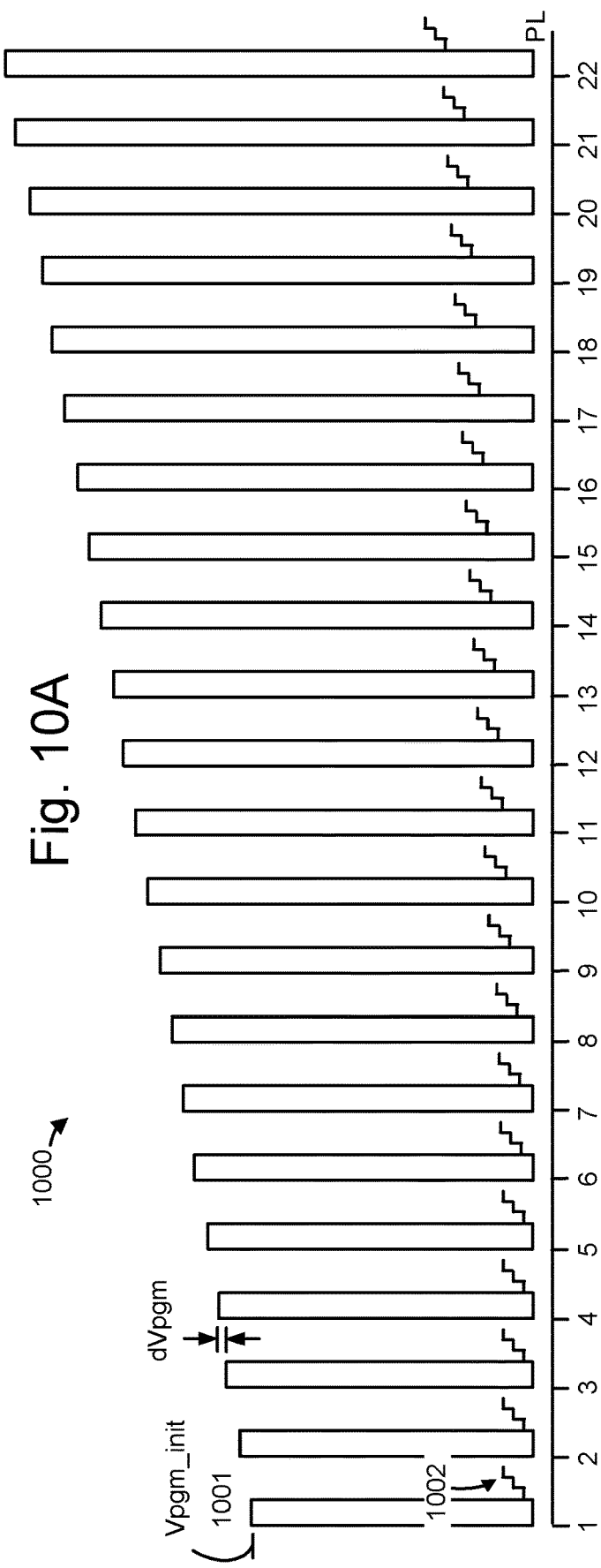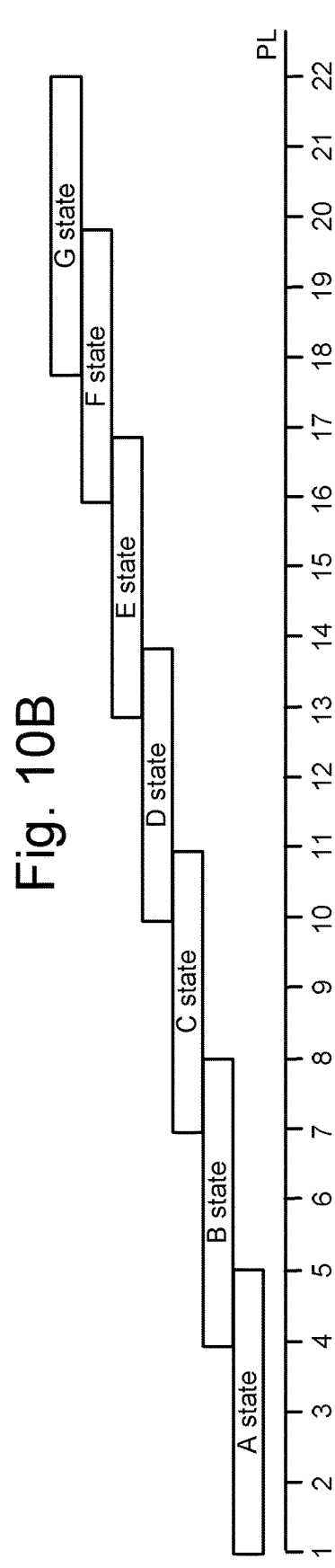

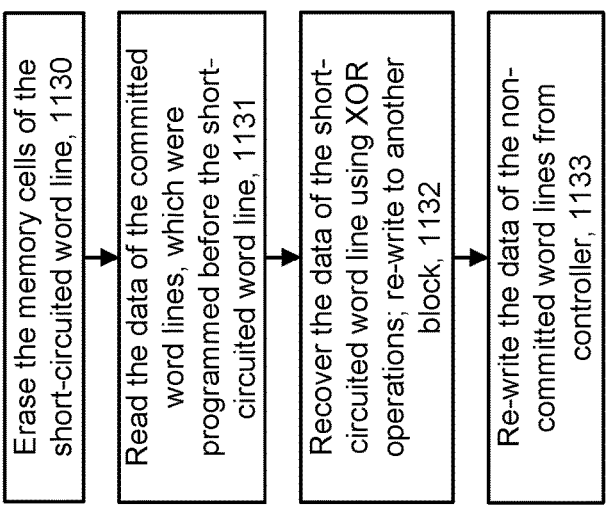
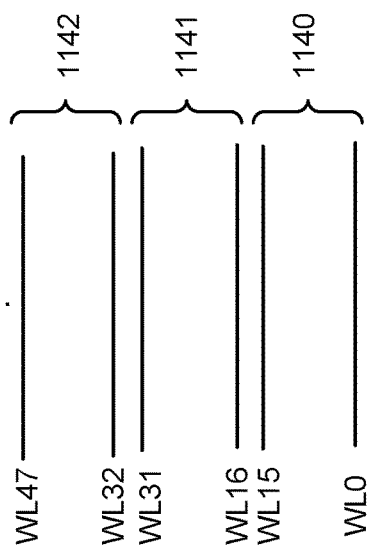
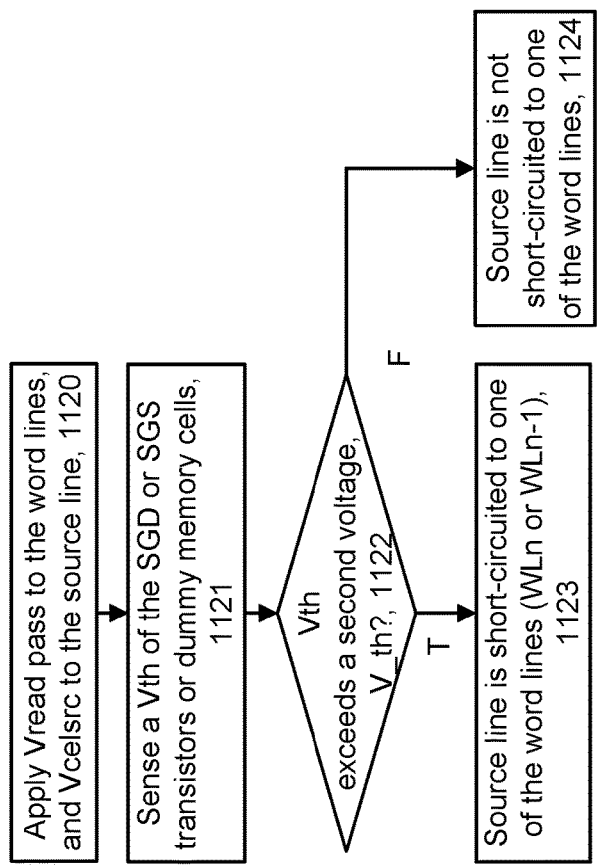

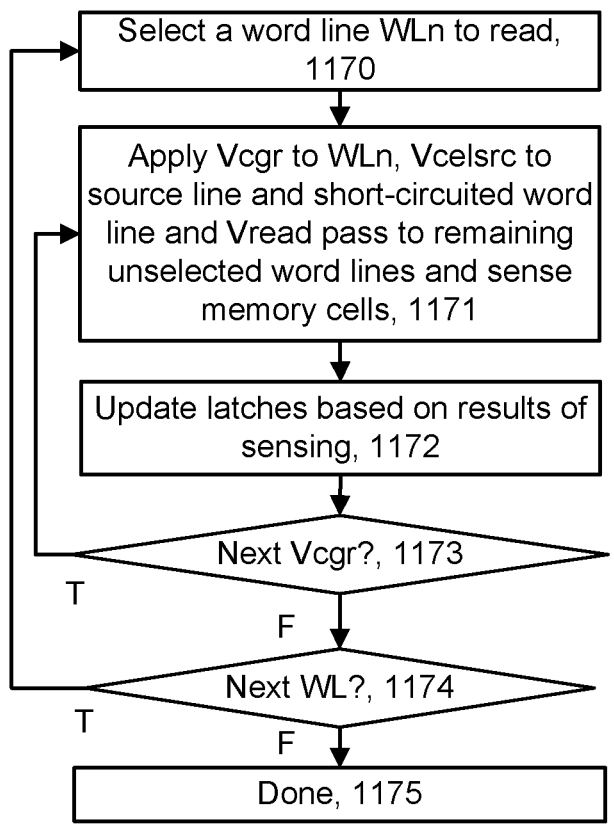

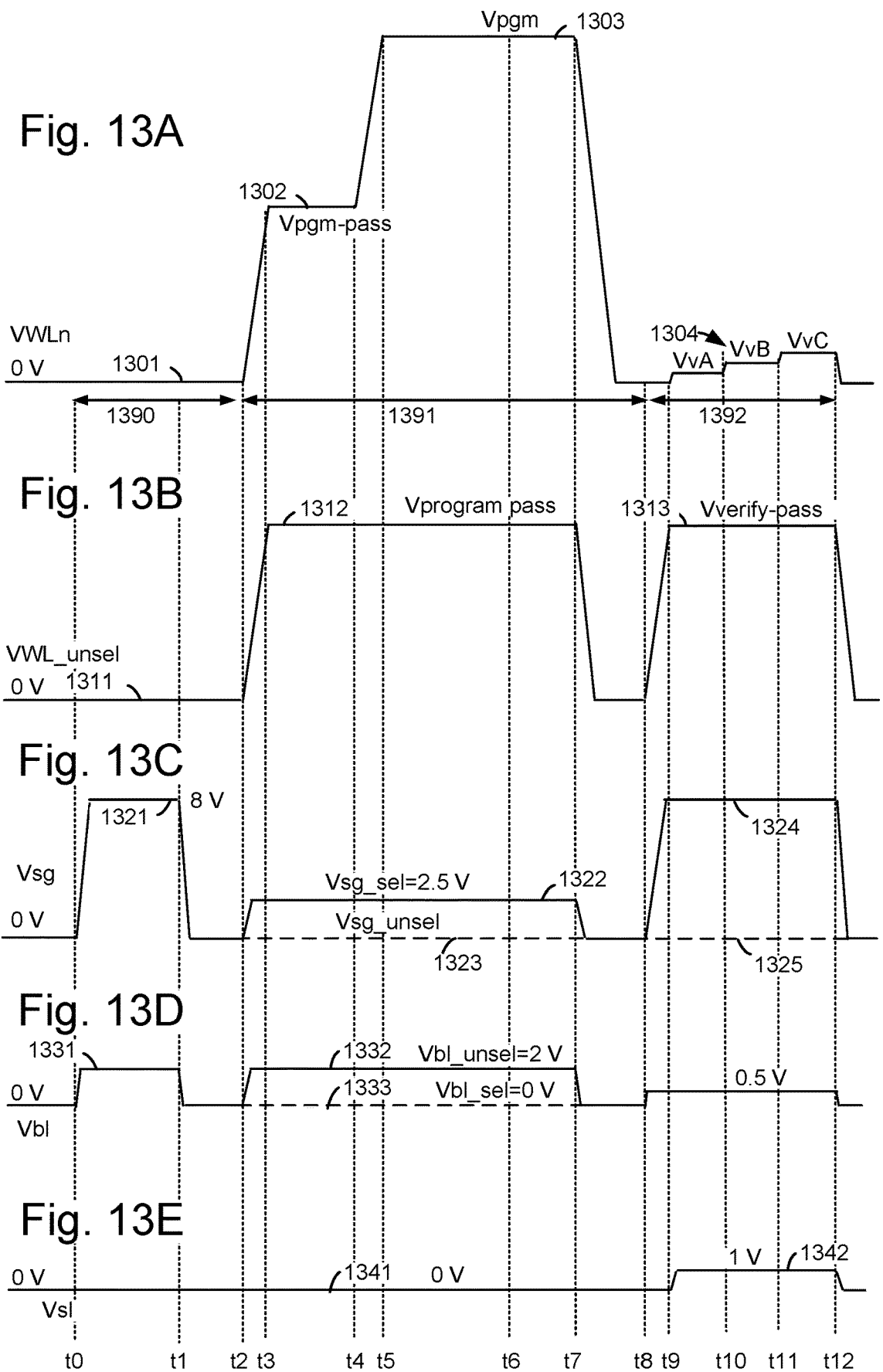

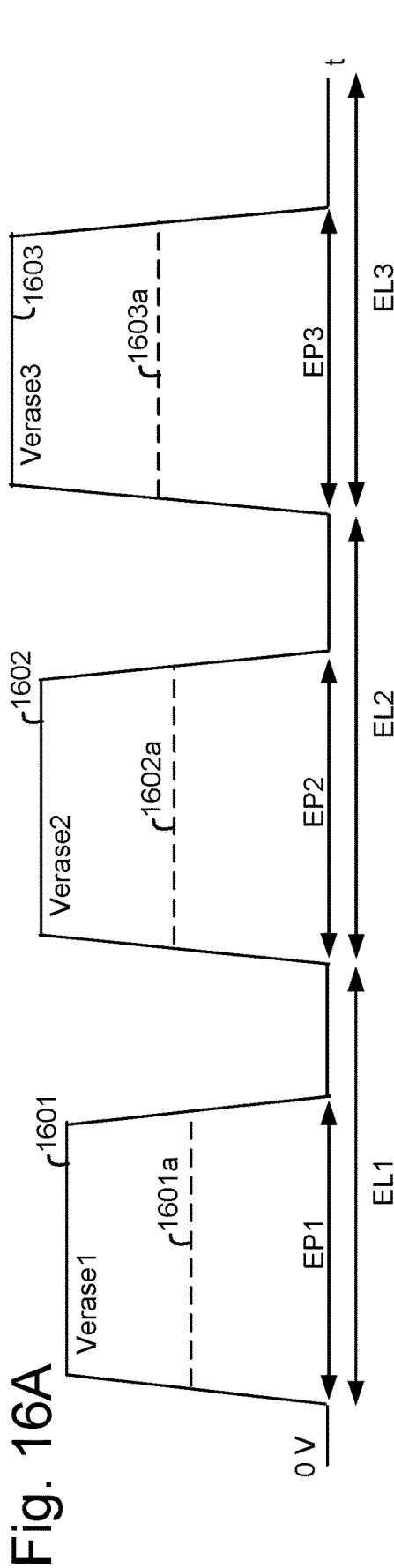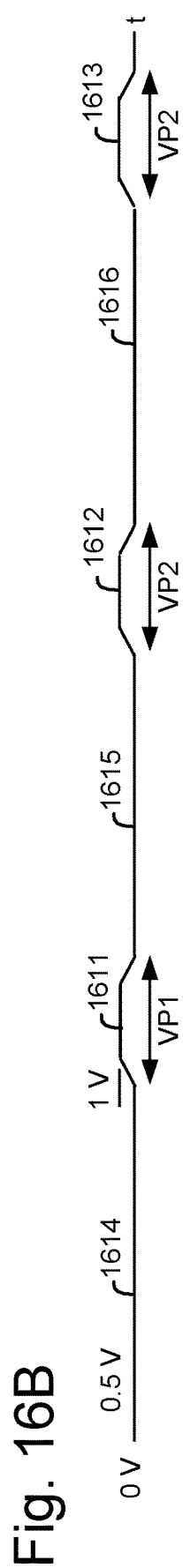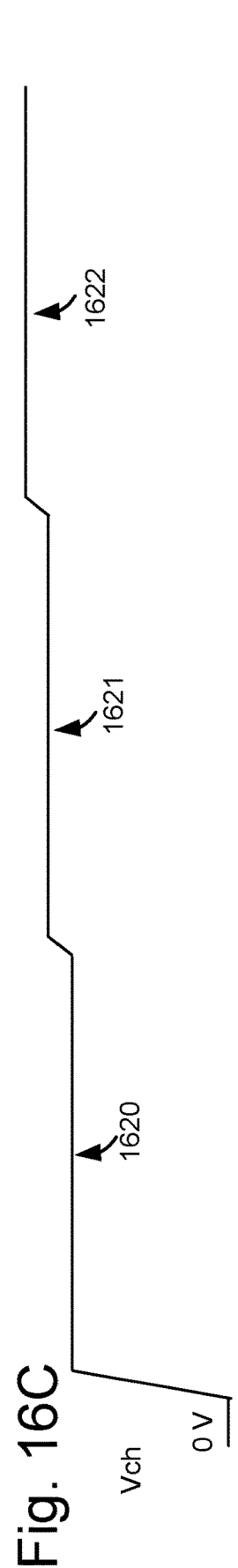

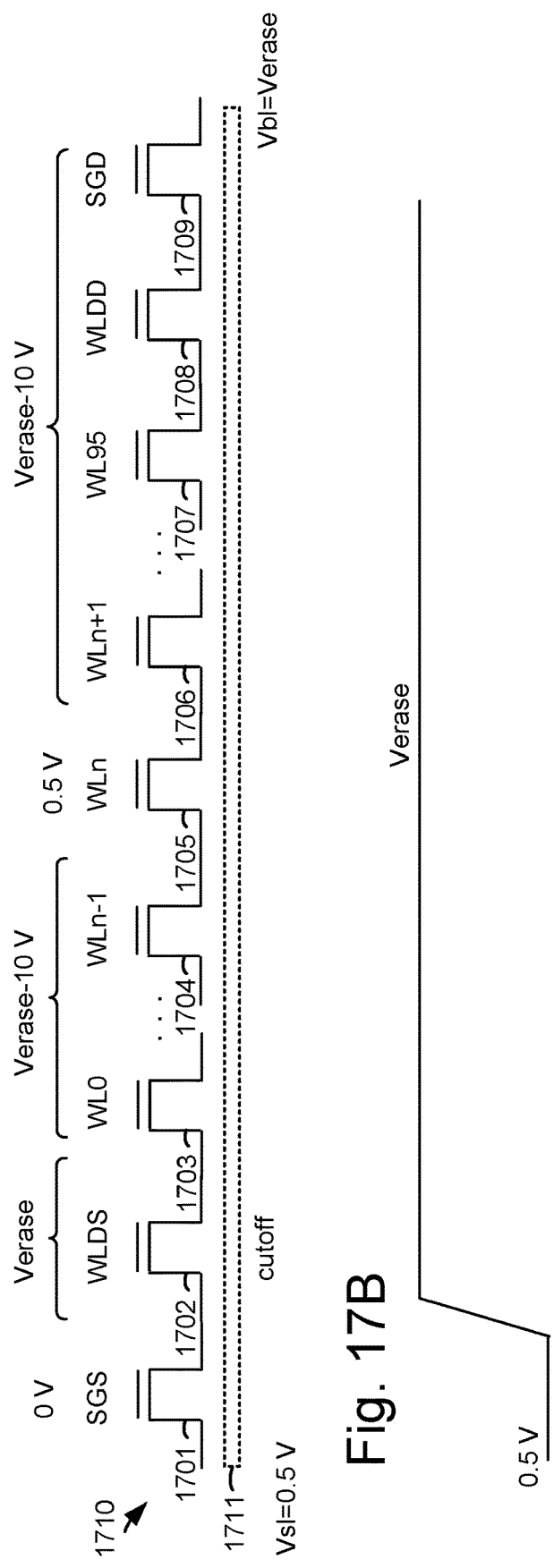
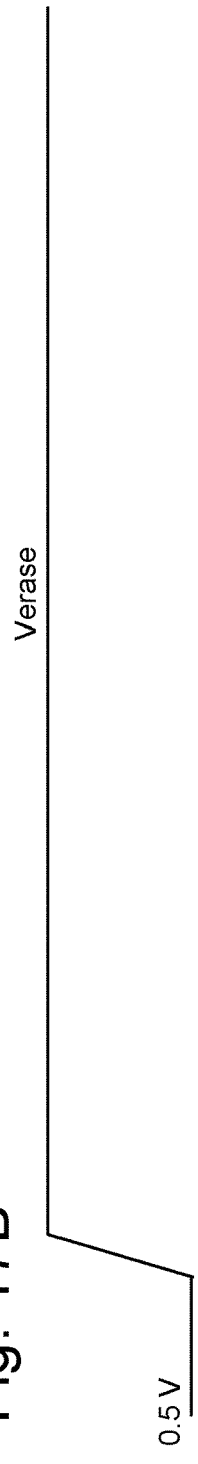
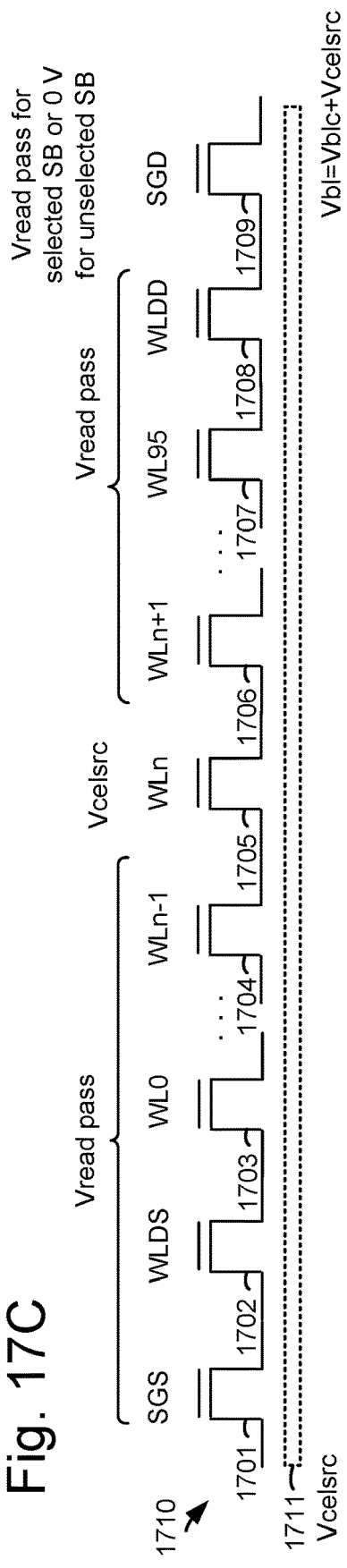
Fig. 17A
Fig. 17B
Fig. 17C

US 10,665,313 B1

DETECTING SHORT CIRCUIT BETWEEN WORD LINE AND SOURCE LINE IN MEMORY DEVICE AND RECOVERY METHOD

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 6B depicts a close-up view of the region 622 of the stack of FIG. 6A.

FIG. 7A depicts an example view of NAND strings in a block BLK0 which is consistent with FIGS. 4 and 6A.

FIG. 7B depicts an example arrangement of memory cells in sub-blocks and word lines consistent with FIG. 7A.

FIG. 8B depicts an example top view of the block BLK0 of FIG. 8A.

FIG. 9A depicts example Vth distributions of a set of memory cells with three bits per cell and eight data states.

FIG. 9B depicts example Vth distributions 910 and 911 of a set of dummy memory cells or select gate transistors without and with, respectively, a word line short circuit to the source line.

FIG. 10A depicts an example voltage signal used in a program operation, consistent with FIG. 9A.

FIG. 10B depicts an example of verify voltages used in different program loops of FIG. 10A.

FIG. 11B depicts a flowchart of an example process for determining if the source line is short circuited to one of the word lines, and identifying the short circuited word line, consistent with step 1105 of FIG. 11A.

FIG. 11C depicts a flowchart of an example process for performing a recovery operation consistent with step 1106 of FIG. 11A.

FIG. 11D depicts an example of committed and non-committed word lines in a block, consistent with step 1131 of FIG. 11C.

FIG. 11G depicts a flowchart of an example process for reading data of the committed word lines, which were programmed before the short circuited word line, consistent with step 1131 of FIG. 11C.

FIG. 13A-13D depict examples of voltage signals which can be used in a program operation, consistent with FIG. 11A.

FIG. 13A depicts voltages applied to a selected word line.

FIG. 13B depicts voltages applied to unselected word lines.

FIG. 13C depicts voltages applied to select gate transistors.

FIG. 13D depicts voltages applied to bit lines.

FIG. 13E depicts a voltage applied to a source line.

FIG. 14A depicts voltages applied to a selected word line.

FIG. 14B depicts voltages applied to unselected word lines.

FIG. 14C depicts voltages applied to select gate transistors.

FIG. 14D depicts voltages applied to bit lines.

FIG. 15A depicts voltages applied to a selected word line.

FIG. 15B depicts a voltage applied to unselected word lines.

FIG. 15C depicts voltages applied to select gate transistors.

FIG. 15D depicts voltages applied to bit lines.

FIG. 16A-16C depict examples of voltage signals which can be used in an erase operation, consistent with FIGS. 11E and 11F.

FIG. 16A depicts an example sequence of erase pulses.

FIG. 16B depicts an example sequence of erase-verify voltages for a short circuited word line.

FIG. 16C depicts an example of channel voltages.

FIG. 17A depicts an example NAND string 1710 and its channel 1711, showing voltages in an erase operation consistent with FIG. 11E.

FIG. 17B depicts a voltage in the channel of FIG. 17A.

FIG. 17C depicts the NAND string of FIG. 17A, showing voltages in an erase-verify operation consistent with FIG. 11E, step 1156 and FIG. 11F, step 1164.

DETAILED DESCRIPTION

Figure 1:
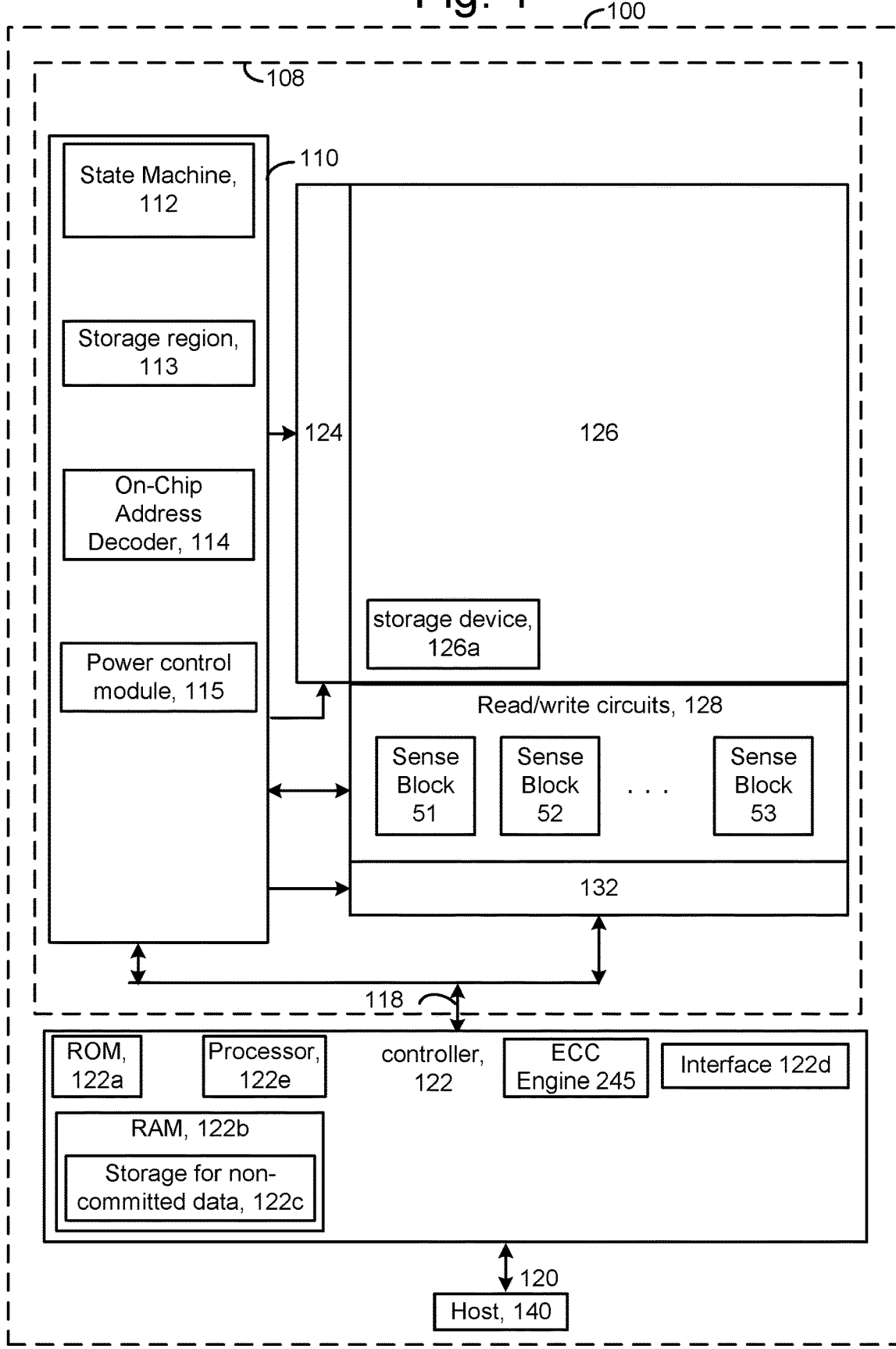
FIG. 1 is a block diagram of an example memory device.

Apparatuses and techniques are described for detecting a short circuit between a word line and a source line in a memory device, and to a method for recovering from such a short circuit.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order. For example, the programming may start at the word line at the source side of the block and proceed to the word line at the drain side of the block, one word line at a time. A programming operation may include one or more sets of increasing program voltages or pulses which are applied to a word line in respective program loops or program-verify iterations, such as depicted in FIGS. 10A and 10B. Verify tests may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 9A). In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

However, a short circuit can develop in the memory device. For example, stress due to many program-erase cycles can cause current leakage between the word lines and a local interconnect, eventually resulting in a short circuit. The local interconnect in turn is connected to a source line such as a substrate so that the short circuit is between a word line and the source line. See the example short circuit 888 in FIG. 8A. The short circuit has a severe effect on the integrity of the user data. For example, if data is programmed after the short circuit occurs, the Vth of the memory cells will appear to be higher than they actually are, so that the program operation is completed and a false program pass status is issued. This data will be incorrectly written and cannot be recovered.

Additionally, data which is programmed before the short circuit occurs cannot be read back since the voltage of the short circuited word line voltage is pulled down by the substrate voltage and cannot be increased to a read pass voltage. Instead, all of the NAND string in the affected block will be non-conductive. This will result in uncorrectable read errors. Early detection of a short circuit is important.

Techniques provided herein address the above and other issues. In one approach, a short circuit between a word line and a source line is detected during the programming of a block. When a selected word line WLn completes programming after an unusually low number of program loops, a further check is performed to confirm that there is a short circuit. This check can involve reading the upper tail Vth of the dummy memory cells or select gate transistors since these memory cells and transistors have a well-defined Vth range that does not normally change. A short circuit will cause the upper tail Vth to be higher than normal. See FIG. 9B.

If a short circuit is confirmed, the short circuited word line is then identified. The selected word line is may or may not be the short circuited word line, depending on which sub-block was programmed at the time the unusually low number of program loops was detected. If the sub-block being programmed is the first programmed sub-block in a set of sub-blocks, the short circuited word line is the most recently previously programmed word line, WLn−1. If the sub-block being programmed is not the first programmed sub-block in a set of sub-blocks, the short circuited word line is the selected word line, WLn. This is because the short circuit will typically occur when the program voltage is at a high level, at the end of a program operation. For example, in FIG. 7B, assume the unusually low number of program loops is detected when WL6 is being programmed in SB0. Then, the short circuited word line is WL5. It is assumed that the short circuit occurred as the programming of WL5 in SB3 was being successfully completed. The effects of the short circuit are then fully realized during the programming of the next programmed word line and sub-block, which are WL6 and SB0, respectively.

In other cases, the short circuited word line is the selected word line, WLn, if the selected sub-block is not the first programmed sub-block in a set of sub-blocks. For example, in FIG. 7B, assume the unusually low number of program loops is detected when WL6 is being programmed in SB1. Then, the short circuited word line is WL6. It is assumed that the short circuit occurred as the programming of WL6 in SB0 was being successfully completed. The effects of the short circuit are then fully realized during the programming of the portion of WL6 in the next programmed sub-block, which is SB1.

To recover from the short circuit, the short circuited word line is erased so that its Vth is below the level of Vsl in a read operation, Vcelsrc. One technique for erasing involves performing a gate-induced drain leakage (GIDL) erase at the SGD transistors. In this case, the channels of the NAND strings are charged up by biasing the SGD transistors in a way which generates holes by GIDL. See FIGS. 17A and 17B. This can involve applying an erase voltage to the bit lines, which is connected to the drain of the SGD transistors, and a control gate voltage to the SGD transistors, to provide a back bias of about 8-10 V to the SGD transistors.

Another technique for erasing involves floating the channel voltage and applying an erase voltage to the word lines other than the short circuited word line. This creates channel gradients which generate electron-hole pairs, where the holes charge up the channel region adjacent to the short circuited word line. See FIGS. 18A and 18B. These approaches are useful in comparison to erase techniques which rely on applying an erase voltage to the source line. Such techniques do not work when a word line is short circuited to the source line.

In another aspect, a short circuit is detected in a read operation. When an uncorrectable read error is detected after reading a word line, a process is performed for detecting the short circuited word line. The short circuited word line can be any word line in the block. The process can involve sensing word lines individually while counting the number of conductive NAND strings. During the sensing, a voltage equal to Vsl is applied to the sensed word line. When the number of conductive NAND strings is higher than a threshold, the currently sensed word line is considered to be the short circuited word line. These and other features are discussed further below.

FIG. 1 is a block diagram of an example memory device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114 and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, read/write circuits 128, controller 122, and so forth.

The off-chip controller 122 (which in one embodiment is an electrical circuit) may comprise a processor 122e, storage devices (memory) such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. If a problem such as a short circuit is subsequently detected in the block, the only chance to recover the committed data is to recover it from the block. However, if a problem is detected before the data is committed, it is still present in the storage location and can be easily re-written to another block. The storage location 122c may store one or more word lines of data. For example, with word lines WL0-WL95, the storage location may store 16 word lines worth of data. See FIG. 11D. The programming of a block can therefore involve transferring data for WL0-WL15 from the host to the storage location 122c and then writing it to the corresponding word lines in the block. Once the data of these word lines is committed, data for WL16-WL31 is transferred from the host to the storage location 122c and then written to the corresponding word lines in the block. The process proceeds accordingly with data for WL32-WL47, WL48-63, WL63-79 and WL80-95.

Assume there is a short circuit detected when writing one of the word lines in WL16-WL31. The data for these word lines has not yet been committed so it can be readily accessed from the storage location and re-written to another block. However, the data of WL0-WL15 has been committed, so these word lines must be read to recover the data using the techniques disclosed herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read-only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
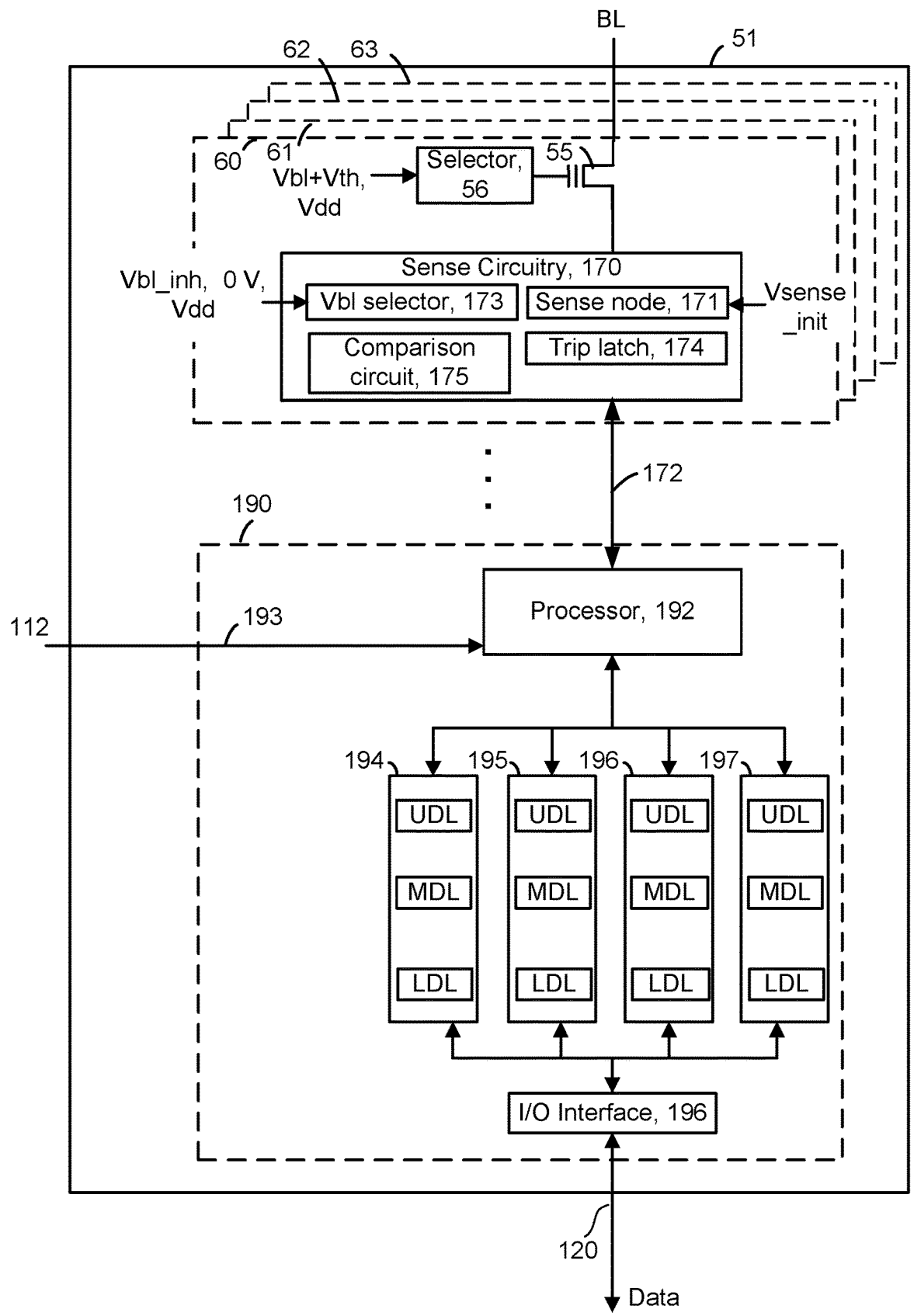
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
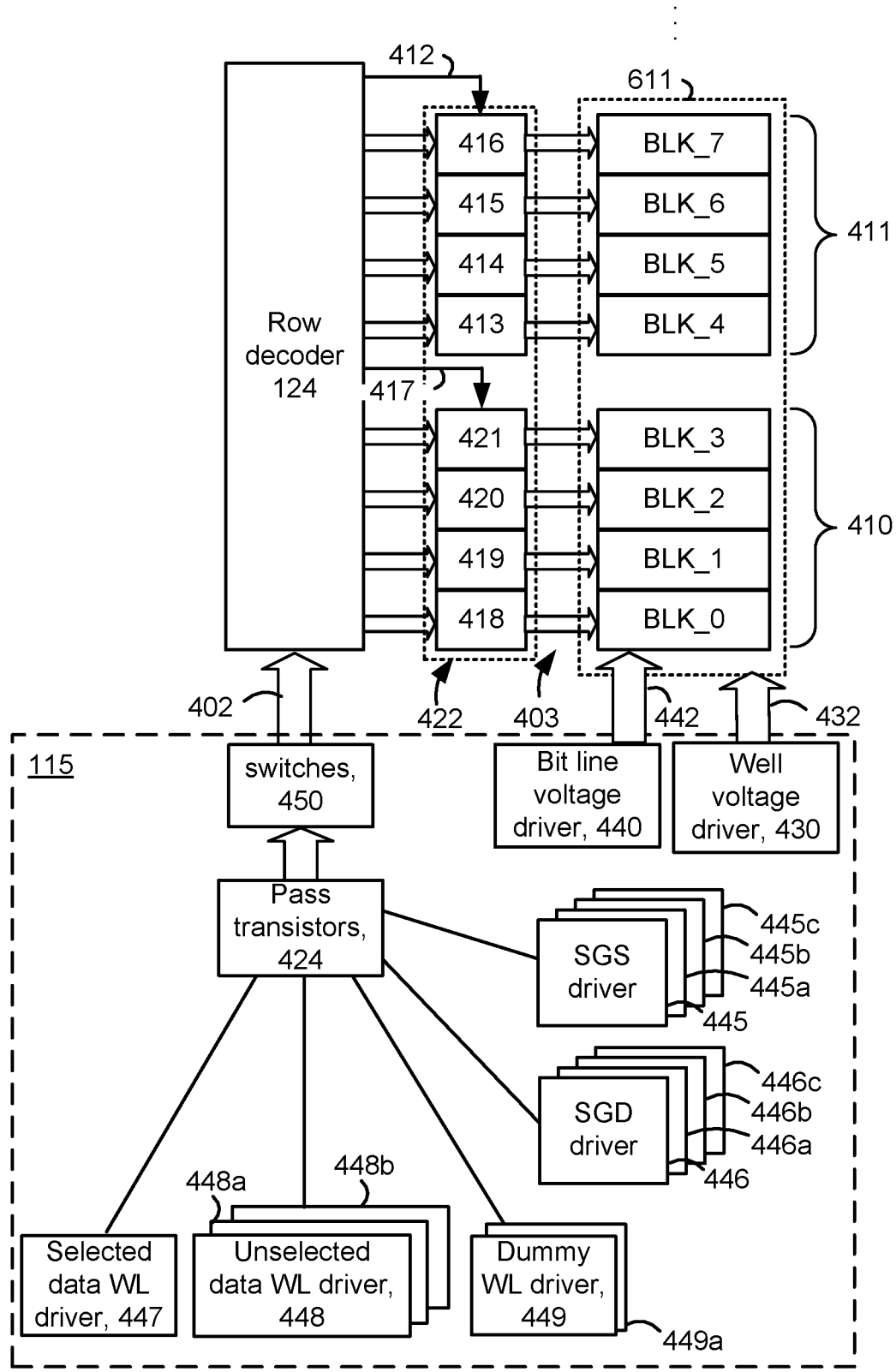
FIG. 3 depicts an example implementation of the power control module 115 of FIG. 1 for providing voltages to blocks of memory cells.

FIG. 3 depicts an example implementation of the power control module 115 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
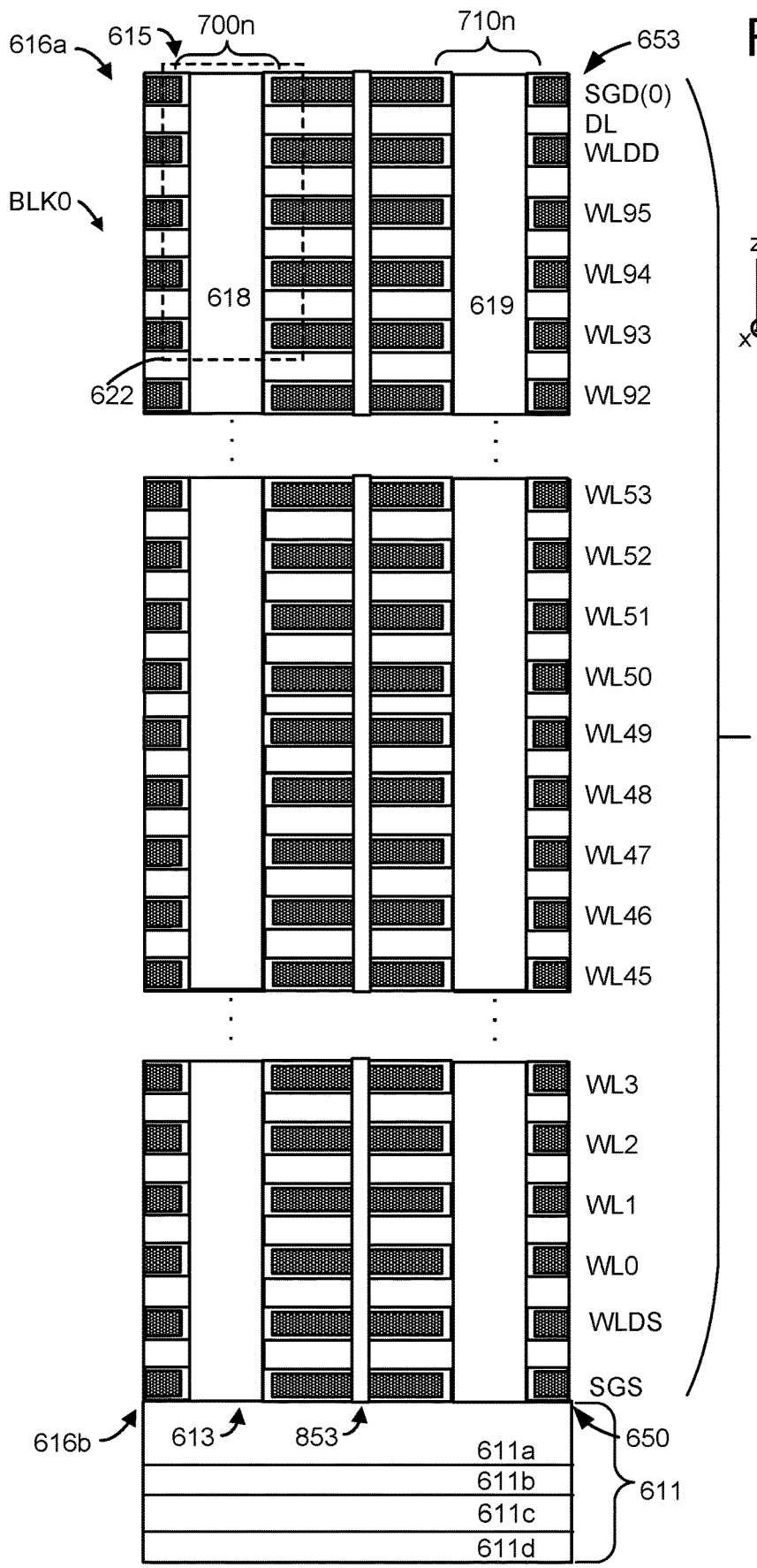
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448, 448a and 448b for unselected data word lines, and dummy word line drivers 449 and 449a which provide voltages on dummy word lines WLDD and WLDS, respectively, in FIG. 6A.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIG. 7A. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. In one approach, the well region 611a is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
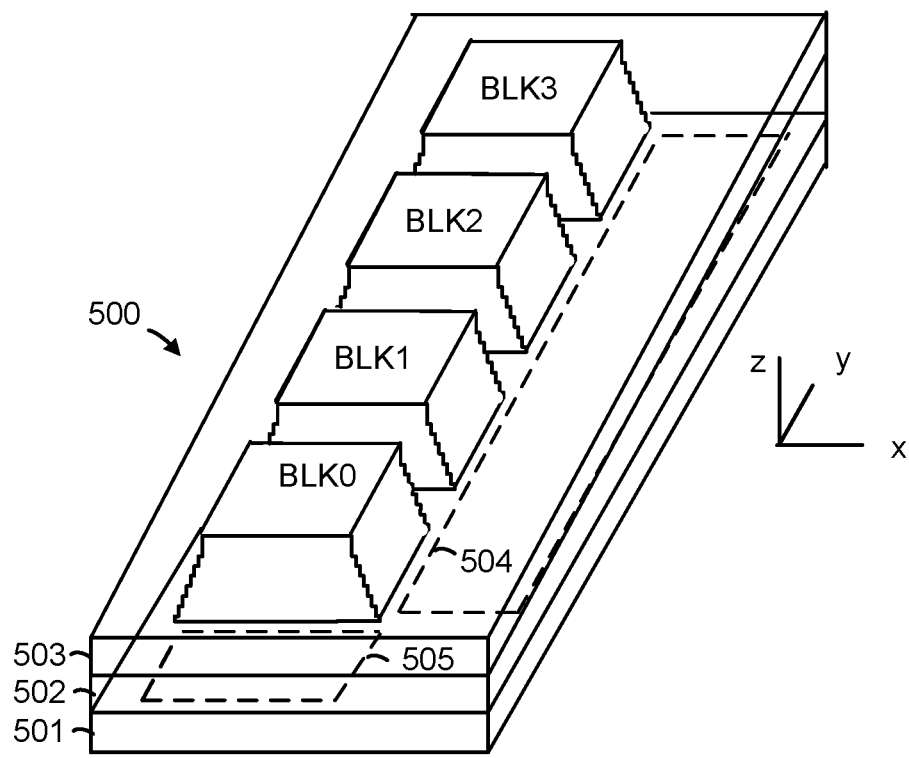
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
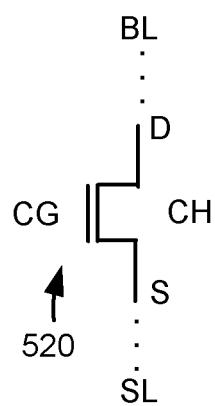
FIG. 5 depicts an example transistor 520.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string.

FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. An example local interconnect 853 is depicted. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Note that the techniques described herein for using a state machine to implement different modes are compatible with various types of memory device including the 3D memory device of FIG. 4-8B and a 2D memory device.

Figure 7A:
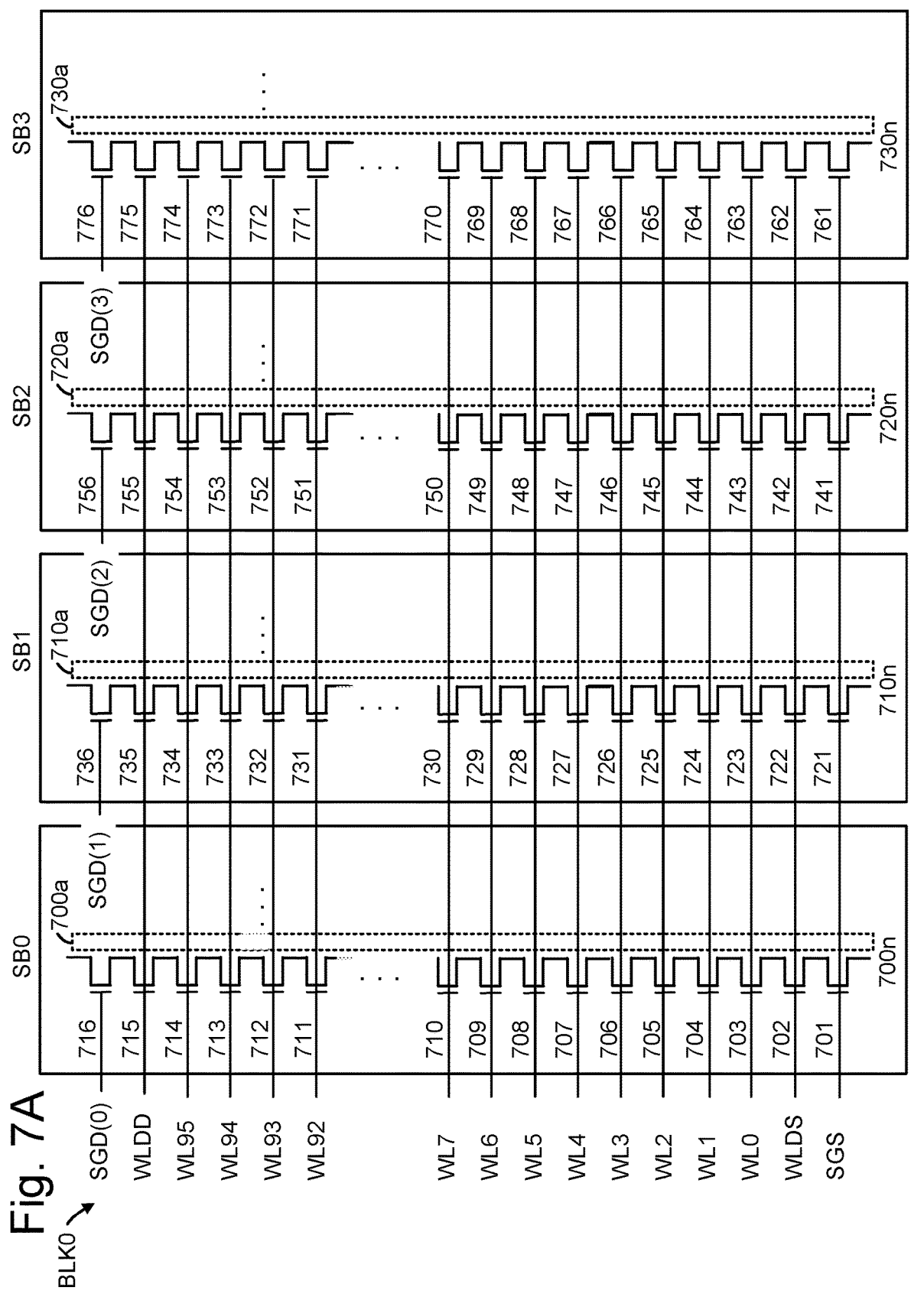

FIG. 7A depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. See also FIG. 7B. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example arrangement of memory cells in sub-blocks and word lines consistent with FIG. 7A. WL0 includes sets of memory cells 800-803 in SB0-SB3, respectively. WL0-WL7 include sets of memory cells 800-803, 804-807, 808-811, 812-815, 816-819, 820-823, 824-827 and 828-831 in SB0-SB3, respectively. WL92-WL95 include sets of memory cells 832-835, 836-839, 840-843 and 844-847 in SB0-SB3, respectively.

As mentioned, the identity of a short circuited word line during programming is based on the sub-block location which completes programming using an unusually low number of program loops are used to complete programming. For example, in FIG. 7B, assume the unusually low number of program loops is detected when the set of memory cells 824 of WL6 is being programmed in SB0. Then, the short circuited word line is WL5. In another example, the unusually low number of program loops is detected when any of the sets of memory cells 825-827 of WL6 are being programmed in SB1-SB3, respectively. Then, the short circuited word line is WL6.

Figure 8A:
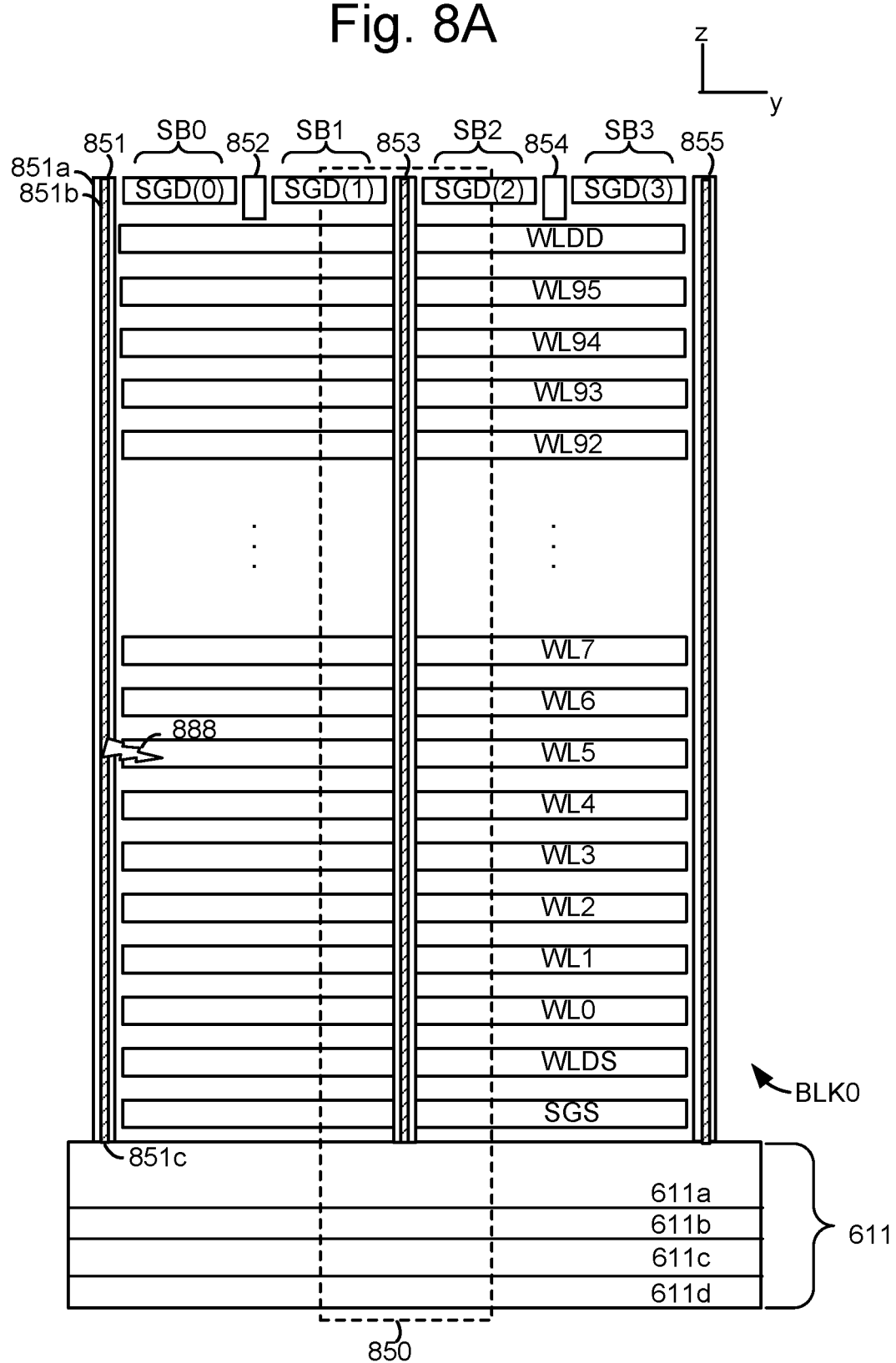
FIG. 8A depicts an example cross-sectional view of the block BLK0 of memory cells consistent with FIG. 6A.

FIG. 8A depicts an example cross-sectional view of the block BLK0 of memory cells consistent with FIG. 6A. The region 850 corresponds to the portion of the block in FIG. 6A. The block comprises a plurality of control gate layers spaced apart vertically and separated by dielectric layers (not depicted). The control gate layers include data word line layers WL0-WL95, dummy word line layers WLDS and WLDD, and select gate layers SGS and SGD. Each layer has the shape of a rectangular plate. Additionally, a separate SGD layer SGD(0)-SGD(3) is provided in each sub-block SB0-SB3, respectively.

The block includes local interconnects (LI) 851, 853 and 855. The LIs 851 and 855 are at opposing edges of the block and the LI 853 is in the middle of the block. The local interconnects can be provided periodically in a block, typically at the edges of a block and in an interior region. Additionally, an isolation region 852 separates the SGD(0) and SGD(1) layers, and an isolation region 854 separates the SGD(2) and SGD(3) layers.

The local interconnect 851 can comprise a conductive material 851b such as metal surrounded by insulating material 851a to prevent conduction with the metal of the adjacent word lines. The local interconnect is connected at its bottom 851c to the well region 611a (FIG. 6A) of the substrate. The substrate is one example of a source line, e.g., a conductive path connected to the source ends of the NAND strings. In other memory device architectures, the source line can be separate from the substrate. For example, in the CMOS under array or circuit under array architecture, the source line is no longer connected to substrate, but the word line to source line short circuit can still occur. When a word line to source line short circuit occurs, a conductive path is formed through the insulating material. An example short circuit 888 is depicted between the local interconnect 851 and WL5.

Each dummy word line layer and data word line layer extends across all sub-blocks of a block. The local interconnect 853 only partially interrupts a word line layer. Each SGS layer may also extend across all sub-blocks of a block, in one approach.

FIG. 8B depicts an example top view of the block BLK0 of FIG. 8A. The SGD layers of SGD(0)-SGD(3) are depicted, along with the local interconnects 851, 853 and 855 and the isolation regions 852 and 854. Each SGD layer has a number of memory holes or NAND strings passing through it. Each circle represents the cross-section of a memory hole or string. A number of bit lines BL0 to BL31 extend above the memory holes, across the top of the stack. Each bit line is connected to one NAND string in each sub-block as indicated by the "X" symbols. For example, BL31 is connected to NAND strings 860 and 861 in SB1 and SB3, respectively. The NAND strings are arranged in rows which extend in the x-direction, and adjacent rows are staggered to improve the memory hole density. Eight rows of NAND strings, with eight NAND string per row, are depicted as a simplified example. In practice, the sub-blocks are elongated in the x direction and contain thousands of NAND strings.

FIG. 9A depicts example Vth distributions of a set of memory cells with three bits per cell and eight data states. The vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 900. After the program operation is successfully completed, the memory cells assigned to the A-G states are represented by the Vth distributions 901-907. The memory cells assigned to the erased state continue to be represented by the Vth distribution 900.

The memory cells which are programmed to the A-G states using verify voltages of VvA-VvG, respectively, are represented by the Vth distributions 901-907, respectively. These Vth distributions are obtained just after completion of the program operation, and assume no program disturb or neighbor word line interference has occurred. The verify voltages are used in the program-verify tests of the memory cells. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight state example. The number of data states could be higher or low than eight data states.

A voltage Vcelsrc is a voltage which is applied to the well region 611a of the substrate in various operations. Vcelsrc is similar to VrB in this example.

FIG. 9B depicts example Vth distributions 910 and 911 of a set of dummy memory cells or select gate transistors without and with, respectively, a word line short circuit to the source line. As mentioned, the Vth distribution of dummy memory cells and select gate transistors is typically fixed at a predictable level as defined by the Vth distribution 910. In one approach, the dummy memory cells and select gate transistors are programmed at the time of manufacture to the desired Vth using a verify voltage Vv, e.g., 1-2 V. When there is a word line short circuit to the source line, the Vth will be sensed as being higher as depicted by the Vth distribution 911. The dummy memory cells or select gate transistors can be sensed using a threshold read voltage of V_th to determine whether the Vth has upshifted. If the Vth of a specified portion of the dummy memory cells or select gate transistors is sensed as being above V_th, e.g., if the specified portion of the NAND strings have a current below a threshold current, it is concluded that there is a word line short circuit to the source line in the block. Typically, the upper tail of the Vth distribution will upshift.

For example, in FIGS. 7A and 7B, assume there is a short circuit between WL5 and the source line. The SGD(0) transistors including the transistor 716 can be sensed while applying a read pass voltage such as 8 V to the word lines including WL5. In practice, the 8 V applied to WL5 will be pulled down to Vcelsrc due to the short circuit, if present. Due to the read pass voltage, the memory cells connected to the word lines other than WL5 will be set in a conductive state. The memory cells connected to WL5 are in a conductive state if they have a Vth<Vcelsrc (e.g., they are in the Er or A states) and in a non-conductive state if they have a Vth>=Vcelsrc (e.g., they are in the B-G states). As depicted in FIG. 9A, Vcelsrc may be at a level which is roughly between the A and B state distributions. In the NAND strings in which the WL5 memory cell is conductive, the Vth of the SGD(0) transistors will be in the expected range of the Vth distribution 910. In the NAND strings in which the WL5 memory cell is non-conductive or weakly conductive, the Vth of the SGD(0) transistors will be in the upper tail of the Vth distribution 911. The overall Vth width and upper tail will increase is there is a short circuit.

FIG. 10A depicts an example voltage signal used in a program operation, consistent with FIG. 9A. The voltage signal 1000 includes a set of program voltages, including an initial program voltage 1001, which are applied to a word line selected for programming. The initial program voltage is represented by Vpgm_init and dVpgm denotes the step size. A single program pass is used having 22 program loops, as an example. The verification signals in each program loop, including example verification signals 1002, can encompass lower assigned data states, then midrange assigned data states and then higher assigned data states as the program operations proceeds, as depicted in FIG. 10B. The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. An example encoding of bits for the Er-C states is 11, 10, 00 and 01, respectively, in the format of upper page (UP)/lower page (LP). The data of the lower and upper pages can be determined by reading the memory cells using read voltages of VrA and VrC; and VrB, respectively.

With three bits per cell, three pages of data can be stored in the memory cells connected to a word line. An example encoding of bits for the Er-G states is 111, 110, 100, 000, 010, 011, 001 and 101, respectively, in the format of UP/middle page (MP)/LP. The data of the lower, middle and upper pages can be determined by reading the memory cells using read voltages of VrA and VrE; VrB; and VrC and VrG, respectively.

FIG. 10B depicts an example of verify voltages used in different program loops of FIG. 10A. The horizontal bars are time-aligned with the program loop axis of FIG. 10A. The bars overlap in some program loops, indicating that verify operations can be performed for multiple data states in the program loop. With eight data states, the bars indicate that verify voltages for the A, B, C, D, E, F and G states are applied in verification signals in program loops 1-5, 4-8, 7-11, 10-14, 13-17, 16-20 and 18-22, respectively. As mentioned, the verification signals in each program loop can encompass lower assigned data states, then midrange assigned data states and then higher assigned data states as the program operation proceeds.

Figure 11A:
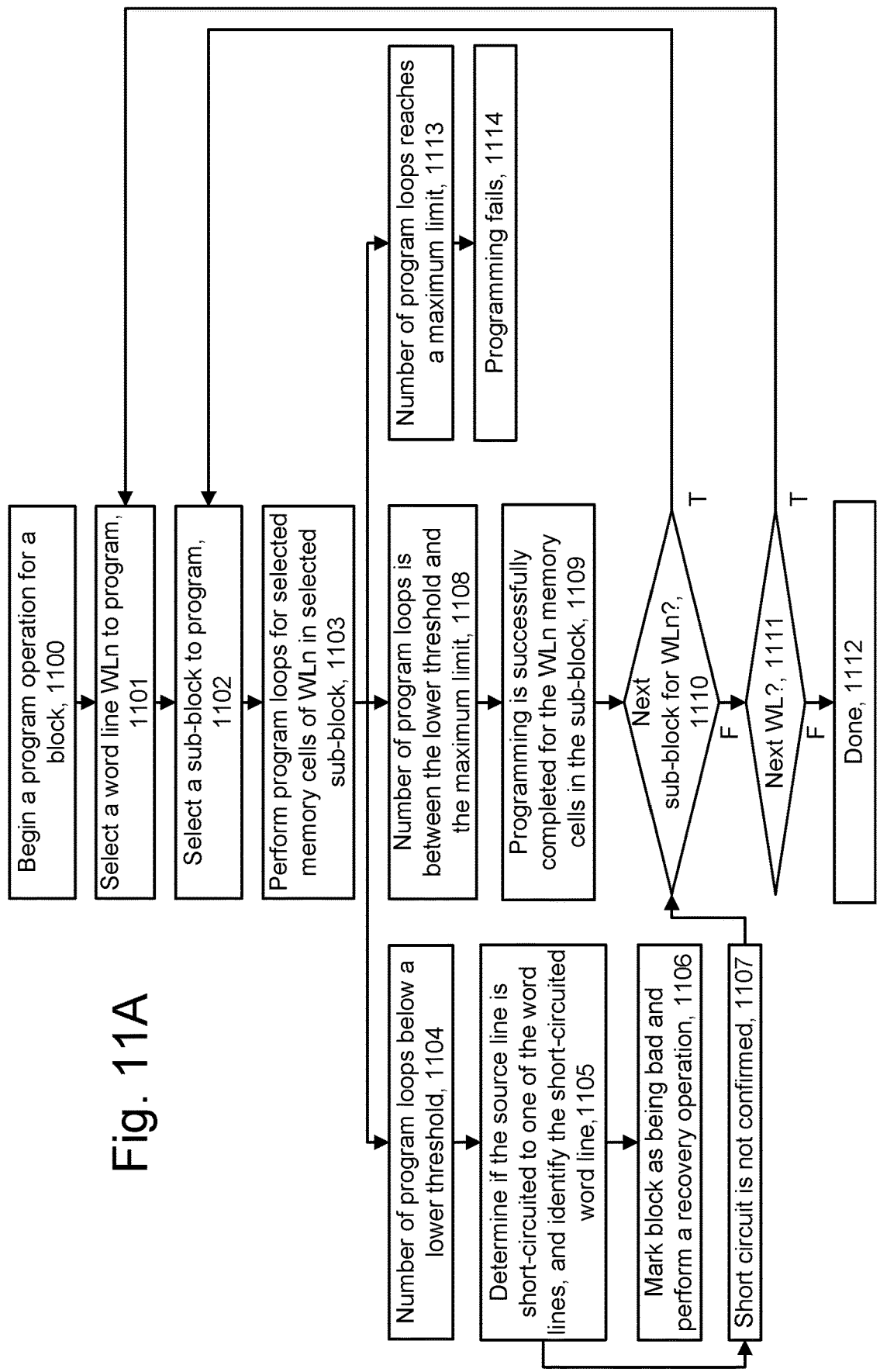
FIG. 11A depicts a flowchart of an example program operation in which a short circuit between a word line and a source line is detected, and a corresponding recovery process is performed.

FIG. 11A depicts a flowchart of an example program operation in which a short circuit between a word line and a source line is detected, and a corresponding recovery process is performed. Step 1100 begins a program operation for a block. The host may transfer data for one or more word lines to the storage location 122c in the controller, for example. Step 1101 includes selecting a word line WLn to program. Step 1102 includes selecting a sub-block to program. Step 1103 includes performing program loops for selected memory cells on WLn in the selected sub-block. For example, in FIG. 7B, if WLn=WL5, and SB0 is the selected sub-block, the set of memory cells 820 is programmed. Performing a program loop refers to applying a program pulse followed by performing verify tests for WLn. The program loops are performed until a completion criterion is met.

Subsequently, three options are depicted. In a first option, the program operation is successfully completed and the number of program loops is below a lower threshold (step 1104), indicating an unusually low number of program loops. In the sequence of FIG. 10B, there are would be at least seven program loops in a program operation. This is one example of a threshold. Normally, the number of program loops used to successfully complete a program operation is about 15-22 in this example.

Step 1104 by itself could be used to conclude that there is a word line to source line short circuit. However, it is more reliable to also perform step 1105 which is an additional step to determine if the source line is short circuited to one of the word lines, and identify the short circuited word line. Step 1104 could be potentially be reached in situations other than a word line to source line short circuit. For example, there could be some other type of short circuit, such as a short circuit between word lines, which would have different characteristics and be resolved by a different recovery operation. Or, there could be a defect in other circuitry such as voltage drivers or sensing circuitry. If there is a word line to source line short circuit, step 1106 marks the block as being bad and performs a recovery operation. If there is not a word line to source line short circuit, step 1107 indicates that the short circuit is not confirmed and a decision step 1110 is reached. The decision step 1110 determines if there is a next sub-block to program for WLn. For example, after the set of memory cells 820 of WL5 in SB0 is programmed, the set of memory cells 821 of WL5 in SB1 is programmed.

If the decision step 1110 is true, step 1102 is reached to select the next sub-block. If the decision step 1110 is false, a decision step 1111 is reached. The decision step 1111 determines if there is a next word line to program. For example, after the set of memory cells 823 of WL5 in SB3 is programmed, the set of memory cells 824 of WL6 in SB0 is programmed. If the decision step 1111 is true, step 1101 is reached to select the next word line. If the decision step 1111 is false, the program operation is done at step 1112.

In a second option, at step 1108, the program operation is successfully completed and the number of program loops is between the lower threshold and a maximum limit, e.g. 23 (FIG. 10A), indicating a normal number of program loops. Step 1109 indicates that the programming is successfully completed for the WLn memory cells in the selected sub-block, and the decision step 1110 is reached.

In a third option, the program operation is not successfully completed and the number of program loops reaches the maximum limit (step 1113). Step 1114 indicates that the programming fails for the WLn memory cells in the selected sub-block. The word line or block may be marked as bad in this case.

Instead of looking at the number of program loops, other techniques can be used to detect a potential short circuit. Another option is to look at the total programming time, which is proportional to the number of program loops, or the number of verify operations.

FIG. 11B depicts a flowchart of an example process for determining if the source line is short circuited to one of the word lines, and identifying the short circuited word line, consistent with step 1105 of FIG. 11A. Step 1120 includes applying Vread pass to the word lines, including the suspected short circuit word line, and applying Vcelsrc to the source line. As mentioned, the Vread pass applied to the short circuited word line will be pulled down to Vcelsrc due to the short circuit, if present.

Step 1121 includes sensing a Vth of the SGD or SGS transistors or dummy memory cells. For example, V_th in FIG. 9B can be applied to the SGD or SGS transistors. The sensing determines if the SGD or SGS transistors or dummy memory cells are in a conductive or non-conductive state. A decision step 1122 determines if Vth exceeds a second voltage, V_th, for at least a specified number of portion of the SGD or SGS transistors or dummy memory cells.

If the decision step is true, step 1123 indicates that the source line is short circuited to one of the word lines, e.g., WLn or WLn−1. If the decision step is false, step 1124 indicates that the source line is not short circuited to one of the word lines.

Another option to confirm the presence of a short circuit is to provide leakage-detection circuitry which directly measures whether there is a short circuit. Such circuitry could apply a voltage to the source line while detecting whether there is a corresponding voltage on a word line, for example, or whether the applied voltage is leaking away.

Another option in place of step 1121 is to measure the Vth of the WLn memory cells using a single control gate voltage, for example. In one approach, Vcelsrc can be applied as the control gate voltage. This is essentially a single level cell (SLC) read. If WLn is a short circuited word line, the WLn memory cells will have a large upshifted upper tail in the Vth distribution. In this option, the decision step 1122 could be applied to the WLn memory cells, where the second voltage is Vcelsrc, for example.

FIG. 11C depicts a flowchart of an example process for performing a recovery operation consistent with step 1106 of FIG. 11A. Step 1130 includes erasing the memory cells of the short circuited word line. Even though there is a leakage between the short circuited word line and the source line, the layers of the memory hole are still healthy so that erasing is feasible. Step 1131 includes reading the data of the committed word lines, which were programmed before the short circuited word line. Step 1132 includes recovering the data of the short circuited word line using XOR operations, and re-writing the data to another block. This step can be used to recover data of WLn in SB0-SB2 when the short circuit occurs when programming WLn in SB3, for example. Moreover, in some cases, XOR operations allow for the recovery of data from two adjacent word lines so that WLn−1 data can be recovered as well. Step 1133 includes re-writing the data of the non-committed word lines from the controller, e.g., to another block.

FIG. 11D depicts an example of committed and non-committed word lines in a block, consistent with step 1131 of FIG. 11C. As mentioned, a copy of the data can be stored in the controller RAM during programming of a set of word lines, as non-committed data. After the programming of the set of word lines is completed, the data is committed, so that the copy is no longer available in the RAM. This example shows sets of word lines 1140, 1141 and 1142 which include WL0-WL15, WL16-WL31 and WL32-WL47, respectively. When the data of WL16-WL31 is being programmed, this data has not yet been committed. However, the data of WL0-WL15 has been committed.

Figure 11E:
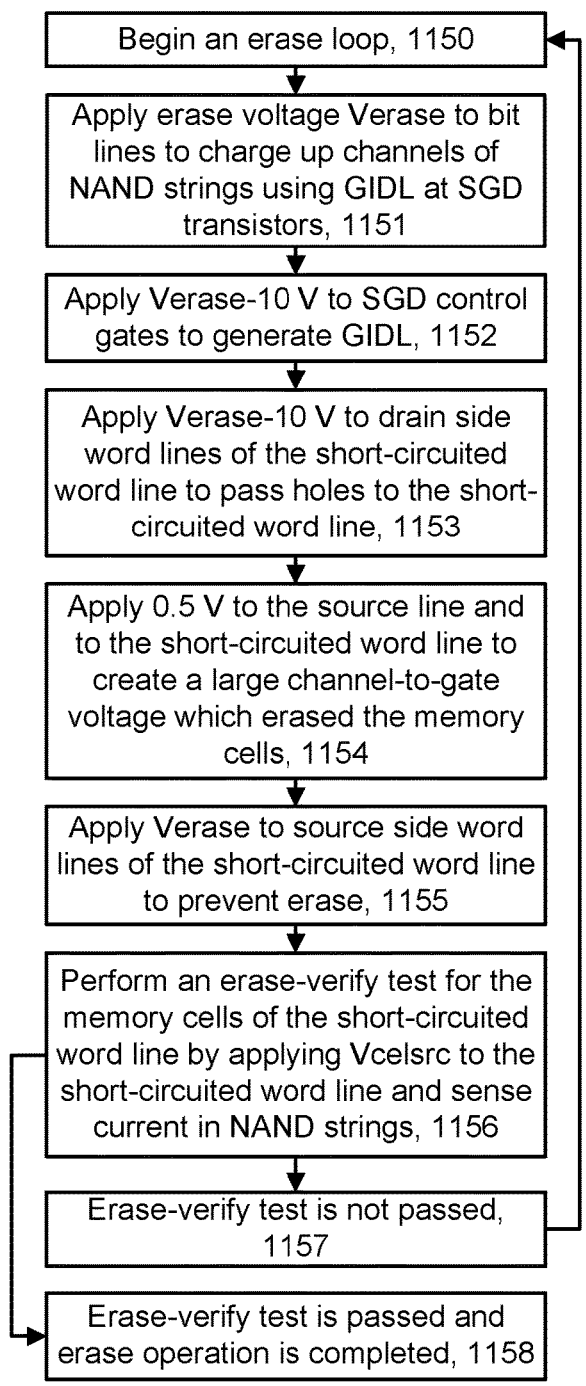
FIG. 11E depicts a flowchart of an example process for erasing the short circuited word line, consistent with step 1130 of FIG. 11C, where a GIDL erase is performed.

FIG. 11E depicts a flowchart of an example process for erasing the short circuited word line, consistent with step 1130 of FIG. 11C, where a GIDL erase is performed. See also FIG. 16A-17C. Step 1150 begins an erase loop. Step 1151 includes applying an erase voltage Verase to the bit lines to charge up the channels of the NAND strings using GIDL at the SGD transistors. Step 1152 includes applying Verase−10 V, for example, to the SGD control gates to generate GIDL. Step 1153 includes applying Verase−10 V to the drain side word lines of the short circuited word line to pass holes to the short circuited word line. For example, if WL6 is the short circuited word line, the drain side word lines are WL7-WL95. The voltage of these word lines should be lower than Verase so that the channel is not cutoff and holes can pass in the channel. Step 1154 include applying a low voltage such as 0.5 V to the source line and to the short circuited word line to create a large channel-to-gate voltage which erases the memory cells of the short circuited word line, without erasing the memory cells of the remaining word lines.

Step 1155 includes applying Verase to the source side word lines of the short circuited word line to prevent erase. For example, if WL6 is the short circuited word line, the source side word lines are WL0-WL5. Steps 1151-1155 may be performed concurrently. Subsequently, step 1156 includes performing an erase-verify test for the memory cells of the short circuited word line by applying Vcelsrc to the short circuited word line and sensing the current in the NAND strings. Vcelsrc is also applied to the source line. See FIG. 17C. The erase-verify test may be performed one sub-block at a time. The erase-verify test determines whether the threshold voltages of the memory cells connected to the short circuited word line are below a first voltage, e.g., Vcelsrc. Step 1157 indicates that the erase-verify test is not passed, e.g., the NAND strings are in a non-conductive state, indicating that the Vth of the memory cells is above Vcelsrc. Or, step 1158 indicates that the erase-verify test is passed, e.g., the NAND strings are in a conductive state, indicating that the Vth of the memory cells is below Vcelsrc, and the erase operation is complete.

Figure 11F:
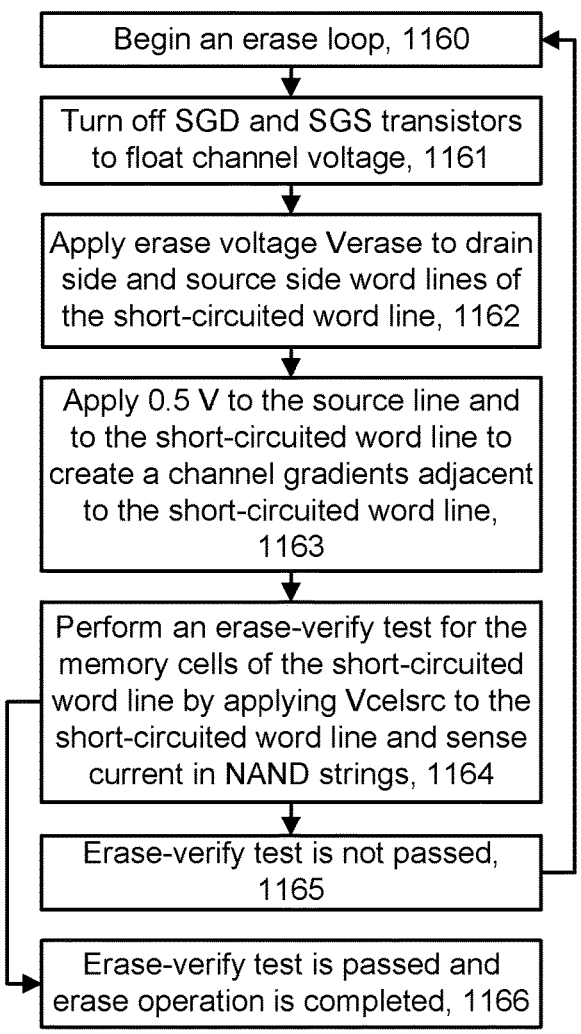
FIG. 11F depicts a flowchart of an example process for erasing the short circuited word line, consistent with step 1130 of FIG. 11C, where a channel gradient erase is performed.

FIG. 11F depicts a flowchart of an example process for erasing the short circuited word line, consistent with step 1130 of FIG. 11C, where a channel gradient erase is performed. See also FIGS. 16A-16A, 17C, 18A and 18B. Step 1160 begins an erase loop. Step 1161 includes turning off (setting in a non-conductive state) the SGD and SGS transistors to float the channel voltage. Step 1162 includes applying an erase voltage Verase to the drain side and source side word lines of the short circuited word line. Step 1163 includes applying a low voltage such as 0.5 V to the source line and to the short circuited word line to create channel gradients (plots 1811 and 1813 in FIG. 18B) adjacent to the short circuited word line.

Steps 1161-1163 may be performed concurrently. Subsequently, step 1164 includes performing an erase-verify test for the memory cells of the short circuited word line by applying Vcelsrc to the short circuited word line and sensing the current in the NAND strings, similar to step 1156. Step 1165 indicates that the erase-verify test is not passed, similar to step 1157, and step 1166 indicates that the erase-verify test is passed and the erase operation is complete, similar to step 1158.

FIG. 11G depicts a flowchart of an example process for reading data of the committed word lines, which were programmed before the short circuited word line, consistent with step 1131 of FIG. 11C. Step 1170 includes selecting a word line WLn to read. WLn is a non-short circuited word line in this example. Step 1171 includes applying Vcgr to WLn, Vcelsrc to the source line and the short circuited word line and Vread pass to the remaining unselected word lines, and sensing memory cells. See FIGS. 14A and 19. Step 1172 includes updating the latches based on the results of the sensing. A decision step 1173 determines if there is a next control gate voltage (Vcgr) to apply to WLn. If the decision step 1173 is true, a next Vcgr is applied at step 1171. If the decision step 1173 is false, a decision step 1174 determines if there is a next word line to read. If this is true, step 1170 selects the next word line. If decision step 1174 is false, step 1175 denotes the end of the read operation. Since the memory cells connected to the short circuited word line have been erased to have a Vth<Vcelsrc, they will be in a conductive state during the sensing so that the memory cells connected to other word lines can be accurately read.

Figure 12A:
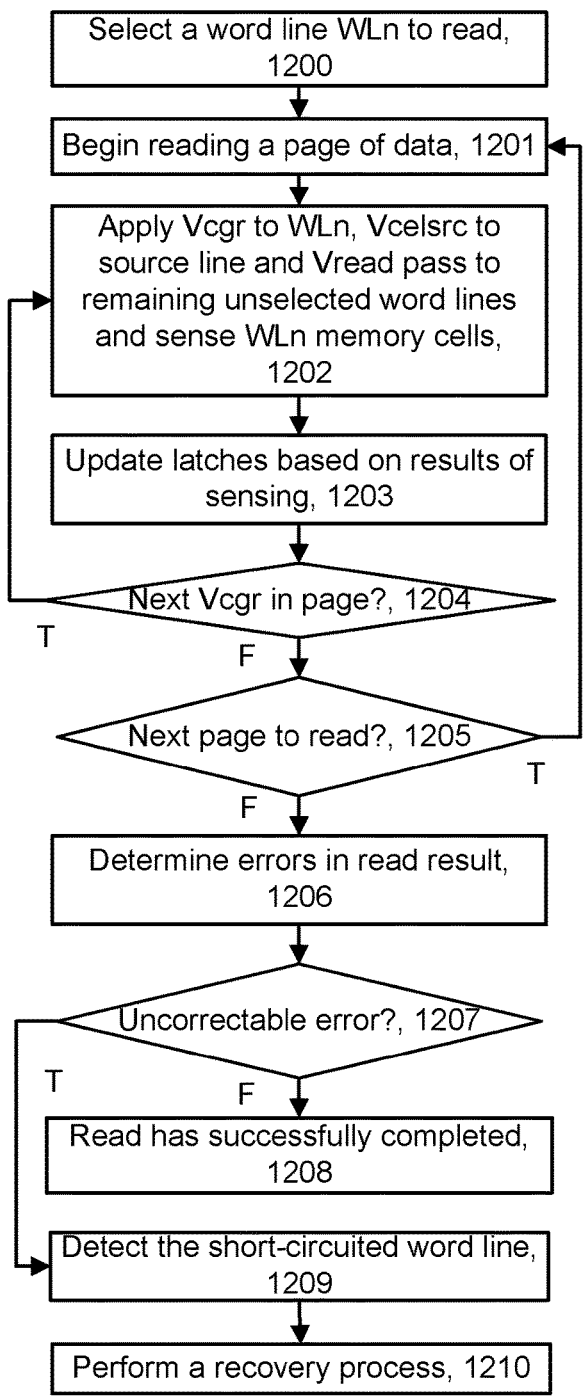
FIG. 12A depicts a flowchart of an example read operation in which a short circuit between a word line and a source line is detected, and a corresponding recovery process is performed.

FIG. 12A depicts a flowchart of an example read operation in which a short circuit between a word line and a source line is detected, and a corresponding recovery process is performed. When multiple read operations are performed, the read pass voltage creates a stress which can lead to a short circuit between the word line and the source line. As with the case of the short circuit occurring during programming, the short circuited word line cuts off the channel and prevents an accurate read out of the other word lines. One difference with the read operation is that the short circuit can develop on any word line and not just the currently selected word line or an adjacent word line. The process for identifying the short circuited word line is therefore more time-consuming.

Step 1200 selects a word line WLn to read. For example, if reading WL0-WL15 in FIG. 11D, the reading can occur sequentially, one word line at a time, proceeding from WL0 to WL15. The reading also occurs one sub-block at a time for each word line. Moreover, one or more pages of data can be read from a word line. Step 1201 includes beginning the reading of a page of data. Step 1202 includes applying Vcgr to WLn, Vcelsrc to the source line and Vread pass to the remaining unselected word lines and sensing the WLn memory cells. Example voltage signals for Vcgr are in FIG. 14A. Step 1203 includes updating the latches based on results of the sensing. A decision step 1204 determines if there is a next Vcgr to apply for the page. If the decision step 1204 is true, step 1202 is repeated with the next Vcgr. If the decision step 1204 is false, a decision step 1205 determines if there is a next page to read. If the decision step 1205 is true, step 1201 is repeated. If the decision step 1205 is false, step 1206 determines if there are errors in the read result. For example, this can occur at the controller using the ECC engine 245.

If the decision step 1207 determines that there is an uncorrectable error, step 1209 includes detecting the short circuited word line and step 1210 includes performing a recovery process. Optionally, the presence of the short circuit can be confirmed before step 1209 by performing a process similar to FIG. 11B. The presence of an uncorrectable error in the read data indicates there may be a short circuited word line. If the decision step 1207 is false, step 1208 indicates that the read operation has successfully completed.

Figure 12B:
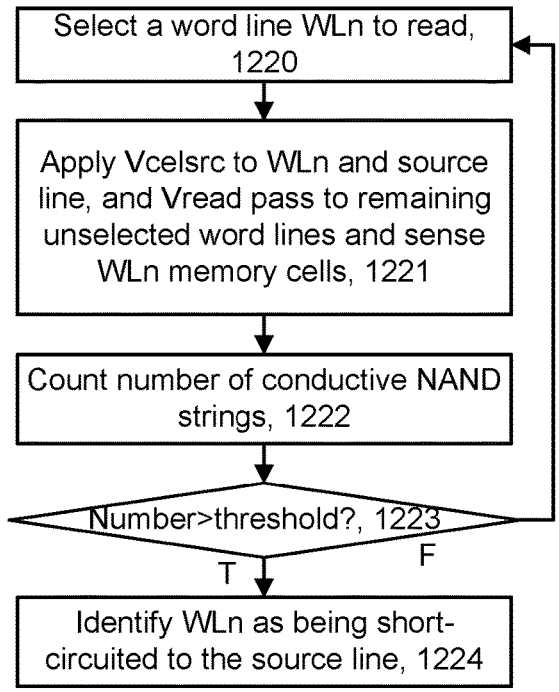
FIG. 12B depicts a flowchart of an example process for detecting a short circuited word line, consistent with step 1209 of FIG. 12A.

FIG. 12B depicts a flowchart of an example process for detecting a short circuited word line, consistent with step 1209 of FIG. 12A. Step 1200 selects a word line WLn to read. One approach is to begin reading the word lines, one word line at a time, starting from WL0 and proceeding sequentially to higher word lines. Generally, it is not known initially which of the word lines might be short circuited. Step 1221 includes applying Vcelsrc to WLn and the source line, and Vread pass to the remaining unselected word lines and sensing the WLn memory cells. Step 1222 includes counting the number of conductive NAND strings, e.g., NAND strings whose current exceeds a reference level. If a decision step 1223 determines that the number exceeds a threshold number, step 1224 identifies WLn as being short circuited to the source line. In this case, there is an unusually high number of conductive NAND strings. If the decision step 1223 is false, step 1220 is reached to select the next word line to read.

In the example of FIG. 9A, Vcelsrc is roughly between the A and B states. Accordingly, with Vcelsrc applied to WLn, the memory cells in the Er and A states will be conductive and the memory cells in the B-G states will be non-conductive. That is, about ¼ of the memory cells of WLn will be conductive, in this eight-state example. If WLn is the short circuited word line, the memory cells of each of the remaining word lines will be conductive, so that the conductive or non-conductive state of the NAND strings will be dictated solely by the conductive or non-conductive state, respectively, of the WLn memory cells. In this case, about ¼ of the associated NAND strings will be in a conductive state since ¼ of the memory cells are in the Er or A state statistically based on a random distribution of states. The threshold in the decision step 1223 can therefore be about ¼ of the NAND strings or slightly lower, such as 15-20% of the total number of NAND strings. Note that the counting can occur for one or more sub-blocks and the comparison can be made for the one or more sub-blocks individually or as a group. To save time, it is possible to obtain the count for just one sub-block for each word line. The threshold in the decision step 1223 (and 1233 in FIG. 12C) can be a function of the magnitude of Vcelsrc relative to the Vth distributions of the different data states.

If WLn is not the short circuited word line, this means there is another word line which is the short circuited word line. In this case, the conductive or non-conductive state of the NAND strings will be dictated by the conductive or non-conductive state, respectively, of the memory cells of WLn and of the short circuited word line. With about ¼ of the WLn memory cells in a conductive state and about ¼ of the memory cells of the short circuited word line in a conductive state, about 1/16 of the associated NAND strings will be in a conductive state statistically. This is less than the threshold in the decision step 1223. When the count is 1/16 of the NAND strings, this indicates WLn is not a short circuited word line.

Figure 12C:
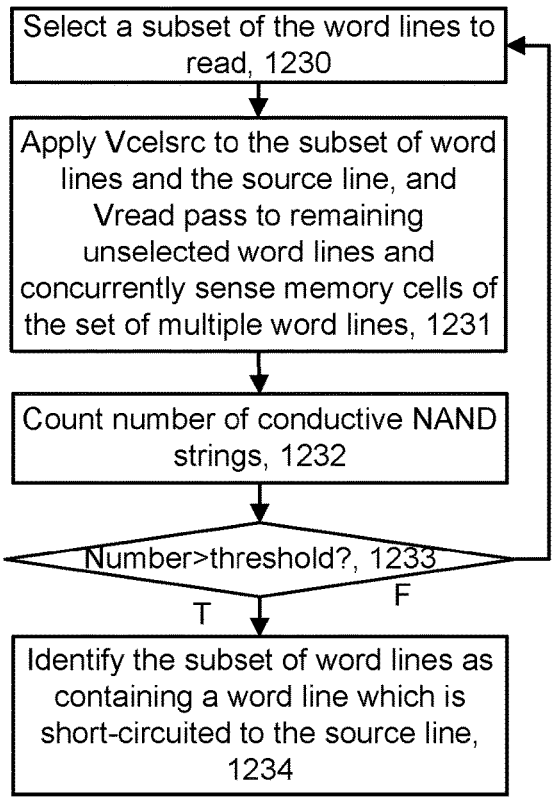
FIG. 12C depicts a flowchart of another example process for detecting a short circuited word line, consistent with step 1209 of FIG. 12A.

FIG. 12C depicts a flowchart of another example process for detecting a short circuited word line, consistent with step 1209 of FIG. 12A. To reduce the amount of time used to identify the short circuited word line, it is possible to concurrently read a subset of the word lines of a block, which comprises multiple word lines, and then, when a subset is identified which contains the short circuited word line, read each word line in the subset one at a time until the short circuited word line is identified. Step 1230 selects a subset of word lines to read. Step 1231 includes applying Vcelsrc to the subset of word lines and the source line, and Vread pass to the remaining unselected word lines and concurrently sensing the memory cells of the set of multiple word lines. Step 1232 includes counting the number of conductive NAND strings. If a decision step 1233 determines that the number exceeds a threshold, step 1234 identifies the subset of word lines as containing a word line which is short circuited to the source line. If the decision step 1233 is false, step 1220 is reached to select the next subset of word lines to read.

After step 1234, the process of FIG. 12B can be performed while being limited to the subset of word lines identified in step 1234, to detect the short circuited word line.

For example, WL0-WL15 can be sensed initially in a subset of sixteen word lines. If there is no short circuited word line detected, WL16-WL31 can then be sensed. If there is a short circuited word line detected in the subset, WL16-WL31 can then be sensed one at a time starting at WL16 until the short circuited word line is detected.

FIG. 13A-13D depict examples of voltage signals which can be used in a program operation, consistent with FIG. 11A. The vertical dimension denotes voltage and the horizontal dimension denotes time, with time points t0-t11. The period of time depicted corresponds to one program loop and includes a pre-charge phase 1390 (t0-t2), a program phase 1391 (t2-t8) and a verify phase 1392 (t8-t12).

FIG. 13A depicts voltages VWLn applied to a selected word line. A plot 1301 represents an initial voltage such as 0 V, a plot 1302 represents a program pass voltage, Vprogram pass, a plot 1303 represents a peak level of Vpgm, and a plot 1304 representing verify voltages of VvE, VvF and VvG, for example, for use in the verify phase. A program pulse comprises the plots 1302 and 1303 in the program phase 1391.

FIG. 13B depicts voltages VWL_unsel applied to unselected word lines. A plot 1311 represents an initial voltage such as 0 V. During the program phase, a plot 1312 represents a Vprogram pass. During the verify phase, a plot 1313 represents Vverify-pass, a verify pass voltage, during the application of the verify voltages VvA-VvC. A sensing operation occurs for the WLn memory cells assigned to the A, B and C states, respectively, during the application of VvA, VvB and VvC, respectively, in this example.

FIG. 13C depicts voltages Vsg applied to select gate transistors. After an initial voltage of 0 V, a plot 1321 represents 8 V during the pre-charge for selected and unselected select gate transistors. The selected select gate (SG) transistors are in a selected sub-block (a sub-block selected for programming), and the unselected SG transistors are in unselected sub-blocks (sub-blocks which are not selected for programming). Subsequently, a plot 1322 with Vsg_sel=2.5 V represents the voltage of the selected SG transistors, and a plot 1323 with Vsg_unsel=2.5 V represents the voltage of the unselected SG transistors. Plots 1324 and 1325 represent Vsg_sel=8 V and Vsg_unsel=0 V, respectively, in the verify phase.

FIG. 13D depicts voltages Vbl applied to bit lines. After an initial voltage of 0 V, a plot 1331 represents a voltage Vbl=2 V during the pre-charge for selected and unselected bit lines. The selected and unselected bit lines are connected to selected and unselected NAND strings, respectively, in a selected sub-block, in one approach. Subsequently, a plot 1332 represents Vbl_unsel=2 V (a voltage on unselected bit lines), and a plot 1333 represents Vbl_sel=0 V (a voltage on selected bit lines).

In the pre-charge phase, a positive Vbl (plot 1331) is provided to the drain-side of the channels of the strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example (plot 1331) to allow Vsl to be passed to the source end of the channel.

In the program phase, VWLn and Vwl_unsel are ramped up, e.g., starting at t2, to provide a capacitive coupling up of the channels of the unselected NAND strings. VWLn is then ramped up further at t4-t5 to the peak program pulse level of Vpgm and held at Vpgm until t7. After the program pulse, VWLn is ramped down to Vss (0 V). Subsequently, in the verify phase, one or more verify tests are performed by applying one or more verify voltages (plot 1304) on WLn and, for each verify voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 1322) and the unselected sub-blocks (plot 1323). During the program pulse, with Vbl=0 V (plot 1333), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program phase, Vbl_unsel can remain high at 2 V for the unselected NAND strings (plot 1332). Vbl_sel can be increased during the verify phase (t8-t11) to 0.5 V as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t12, Vbl is decreased to 0 V so that the SGD transistors are cutoff and the channel region has a floating voltage.

FIG. 13E depicts a voltage Vsl applied to a source line, e.g., at the well 611a. This is also referred to as a source line voltage since it is at the source end of the NAND strings. A plot 1341 represents Vsl=0 V during the pre-charge and program phases. A plot 1342 represents Vsl=1 V (Vcelsrc) during the verify phase.

FIG. 14A-14D depict examples of voltage signals which can be used in a recovery read operation, consistent with FIG. 11G. The vertical dimension denotes voltage and the horizontal dimension denotes time, with time points W412. The period of time depicted corresponds to a read operation for three pages of data. In particular, a lower page of data is read in the time period 1490 from t1-t3 using the read voltages VrA and VrE, a middle page of data is read in the time period 1491 from t5-t8 using the read voltages VrB, VrD and VrF, and an upper page of data is read in the time period 1492 from t10-t12 using the read voltages VrC and VrG.

Figure 14A:
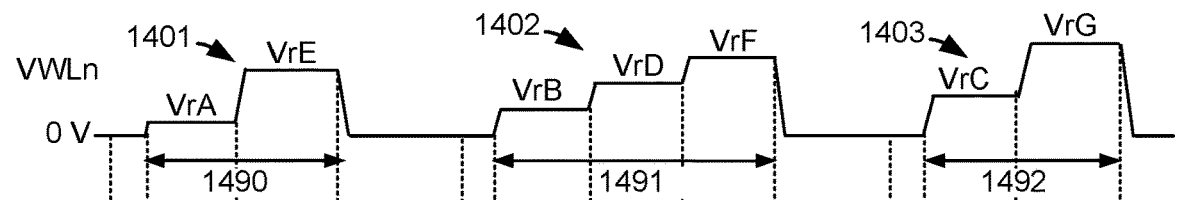
FIG. 14A-14D depict examples of voltage signals which can be used in a recovery read operation, consistent with FIG. 11G.

FIG. 14A depicts voltages VWLn applied to a selected word line. For a selected word line which is not a short circuited word line, an initial voltage of 0 V is increased to VrA and then to VrE (plot 1401) for the lower page read, and is then returned to 0 V. The voltage is then increased to VrB, VrD and VrF (plot 1402) for the middle page read, and is then returned to 0 V. The voltage is then increased to VrC and VrG (plot 1403) for the upper page read, and is then returned to 0 V. Sensing occurs during the application of each control gate read voltage for the memory cells connected to WLn in a selected sub-block. Reading can occur one sub-block at a time, as mentioned.

Figure 14B:
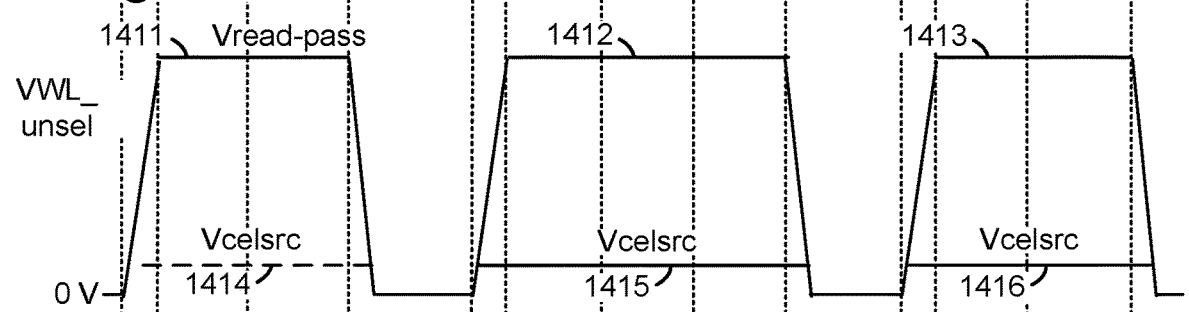

FIG. 14B depicts voltages VWL_unsel applied to unselected word lines. During the application of the WLn voltages for the first, second and third page reads of FIG. 14A, plots 1411, 1412 and 1413, respectively, indicate that a read pass voltage, Vread pass, is applied to the unselected word lines which are not short circuited word lines. The plots 1414, 1415 and 1416 represent Vcelsrc being applied to the short circuited word line during the lower, middle and upper page reads, respectively. The short circuited word line is an unselected word line when a recovery read is performed on another, non-short circuited word line.

Figure 14C:
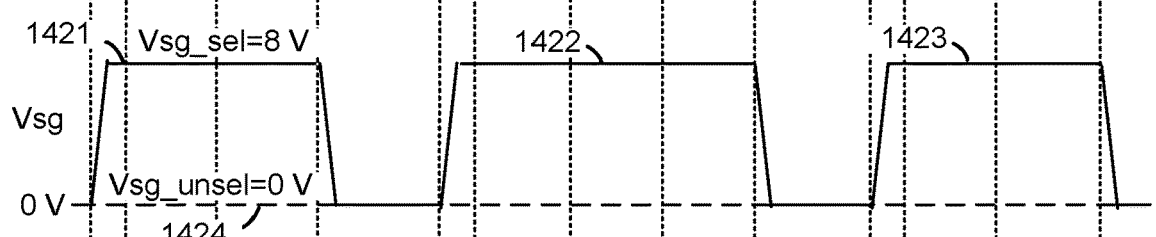

FIG. 14C depicts voltages Vsg applied to select gate transistors. The voltage is represented by plots 1421, 1422 and 1423 during the lower, middle and upper page reads, respectively, for the selected sub-block in which the read operation occurs. The selected select gate (SG) transistors are provided in a conductive state to allow sensing to occur. The voltage signal 1424 is provided for the select gate transistors of the unselected sub-blocks. These select gate transistors are provided in a non-conductive state to avoid interfering with the sensing in the selected sub-block.

Figure 14D:
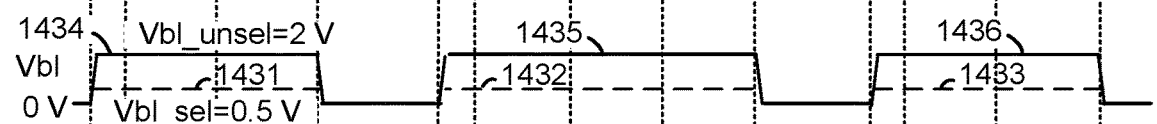

FIG. 14D depicts voltages Vbl applied to bit lines. Vbl=0.5 V is represented by plots 1431, 1432 and 1433 for the selected bit lines during the reading of the lower, middle and upper pages, respectively. This Vbl allows sensing to occur, as discussed in connection with FIG. 2, for the selected sub-block. Plots 1434, 1435 and 1436 depict Vbl=2 V for the unselected bit lines, if any. In some cases, all of the memory cells are read so that there are no unselected bit lines.

Figure 14E:
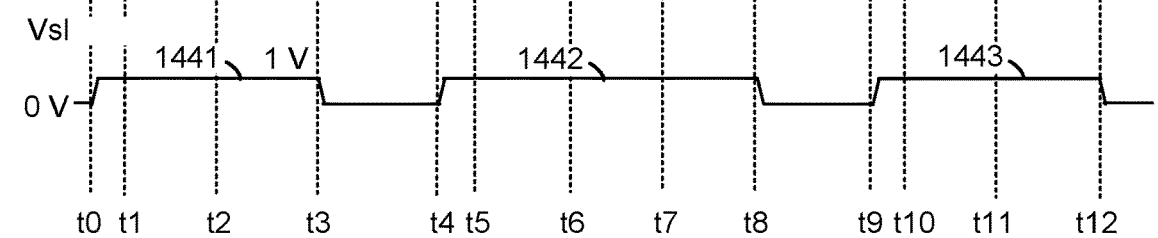
FIG. 14E depicts a voltage applied to a source line.

FIG. 14E depicts a voltage Vsl applied to a source line, e.g., at the well 611a. Plots 1441, 1442 and 1443 represents Vsl=1 V, for example. Vsl may start at 0 V and periodically return to 0 V as depicted.

FIG. 15A-15D depict examples of voltage signals which can be used in a read operation, consistent with FIGS. 12B and 12C.

Figure 15A:
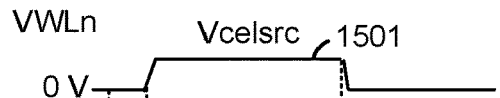
FIG. 15A-15D depict examples of voltage signals which can be used in a read operation, consistent with FIGS. 12B and 12C.

FIG. 15A depicts voltages VWLn applied to a selected word line. A voltage of Vcelsrc, e.g., 1 V, is applied from t1-t2 (plot 1501). Sensing occurs during the application of the voltage for the memory cells connected to WLn. Reading can occur one sub-block at a time, as mentioned.

Figure 15B:
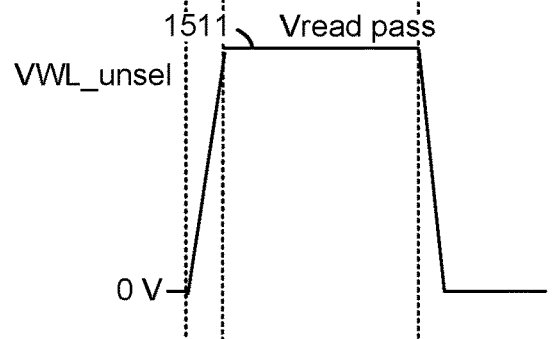

FIG. 15B depicts a voltage VWL_unsel applied to unselected word lines. A voltage of Vread pass, e.g., 8 V, is applied from t1-t2 (plot 1511).

Figure 15C:
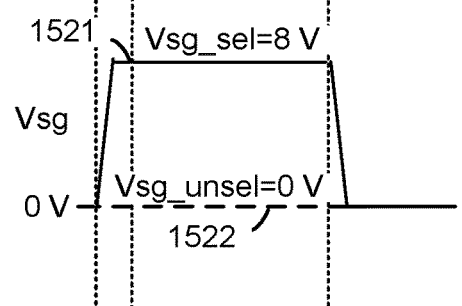

FIG. 15C depicts voltages Vsg applied to select gate transistors. The selected select gate (SG) transistors are provided in a conductive state (plot 1521, Vsg_sel=8 V) to allow sensing to occur. The select gate transistors of the unselected sub-blocks are provided in a non-conductive state (plot 1522, Vsg_unsel=0 V) to avoid interfering with the sensing in the selected sub-block.

Figure 15D:
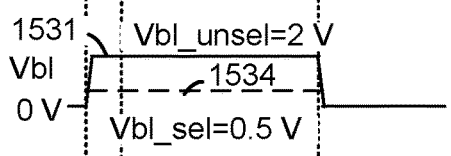

FIG. 15D depicts voltages Vbl applied to bit lines. Vbl_sel=0.5 V is represented by plot 1534 for the selected bit lines. This Vbl allows sensing to occur, as discussed in connection with FIG. 2, for the selected sub-block. Plot 1531 depicts Vbl=2 V for the unselected bit lines, if any. In some cases, all of the memory cells are read so that there are no unselected bit lines.

Figure 15E:
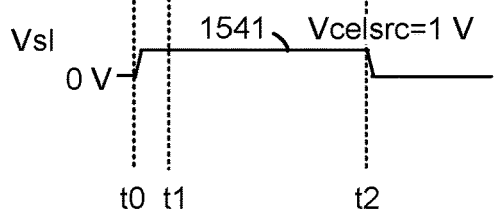
FIG. 15E depicts a voltage applied to a source line.

FIG. 15E depicts a voltage Vsl applied to a source line. Plot 1541 represents Vsl=Vcelsrc=1 V, for example, which is the same voltage on WLn.

FIG. 16A-16C depict examples of voltage signals which can be used in an erase operation, consistent with FIGS. 11E and 11F. The vertical direction denotes voltage and the horizontal direction denotes a common time axis.

FIG. 16A depicts an example sequence of erase pulses. The sequence includes three erase pulses in three erase loops EL1-EL3. EL1-EL3 include an erase pulse EP1-EP3, respectively, with voltages of Verase1-Verase3 (plots 1601-1603, respectively), respectively, and a verify pulse VP1-V3 respectively (plots 1611-1613, respectively) (see FIG. 16B). The sequence also depicts a voltage which is 10 V below the erase voltages of plots 1601-1603 in plots 1601a-1603a, respectively.

In the approach of FIGS. 17A and 17B, the erase pulse is applied to the bit line, and the voltage which is equal to Verase−10 V is applied to the non-short circuited word lines. The erase voltage may increase from an initial level such as 0 V to a relatively high positive voltage such as 20 V in EL1 and then return to 0 V. The peak erase voltage may step up in magnitude in each successive erase loop, in one approach. The erase voltage can increase to its peak level in one or more steps in each pulse.

FIG. 16B depicts an example sequence of erase-verify voltages for a short circuited word line. Plots 1614-1616 represent the voltage of the short circuited word line during the erase pulses of EP1-EP3. This word line voltage is set to a low level such as 0.5 V (e.g., the same level applied to the source line) during the application of the erase pulses to set a large channel-to-gate voltage for the memory cells. The erase loops EL1-EL3 include verify pulses VP1-VP3, respectively, in which the plots 1611-1613 represent the word line voltage (e.g., an erase-verify voltage) during an erase-verify test. The erase-verify voltage can be equal to Vsl during a read operation, e.g., Vcelsrc=1 V, so that the Vth of the memory cells of the short circuited word line will be erased below Vcelsrc. This allows these memory cells to be provided in a conductive state during the recovery read of other word lines, when Vcelsrc is applied to the short circuited word line and the source line.

FIG. 16C depicts an example of channel voltages. When the first-third erase pulses are applied, the channels of the NAND strings in the block are increased from an initial level such as 0 V to elevated levels depicted by plots 1620-1622, respectively, in EL1, EL2 and EL3, respectively.

FIG. 17A depicts an example NAND string 1710 and its channel 1711, showing voltages in an erase operation consistent with FIG. 11E. The NAND string includes an SGS transistor 1701, a source-side dummy memory cell 1702, source-side data memory cells 1703-1704 of the selected word line, WLn (connected to memory cell 1705), drain-side data memory cells 1706-1707 of WLn, a drain-side dummy memory cell 1708 and an SGD transistor 1709.

This erase technique involves charging up the channels by generating holes at the SGD transistors using GIDL. A control gate voltage is applied to the SGD transistors which is several Volts, e.g., 10 V, lower than Verase to provide a back bias (drain to gate voltage) which causes GIDL. The drain-side data word lines WLn+1 to WL95 may receive the same voltage as the SGD transistors as this avoids cutting off the channel and allows the holes to move in the channel toward WLn. WLn receives a low voltage such as 0.5 V as depicted in FIG. 16B. The source-side data word lines WL0 to WLn−1 may receive the same voltage as the SGD transistors as this allows the holes to continue to move in the channel toward the SGS transistor to provide uniform boosting throughout the channel. The SGS transistors may be set at 0 V to provide them in a non-conductive state. This prevent electrons in the source line from discharging the charged up channel.

The source-side dummy word line WLDS may be set at Verase to provide the associated channel region in a cutoff state. This prevents holes from moving to the source line from the channel, potentially increasing Vsl and the WLn voltage which is short circuited to the source line. An increase in Vsl would prevent or slow the erasing of the WLn memory cells and interfere with the erase-verify test.

If there are multiple source-side dummy word lines, one approach is to apply Verase to a first source-side dummy word line which is adjacent to WL0, and to apply a lower voltage such as Verase−10 V to a second source-side dummy word line which is adjacent to the first source-side dummy word line. This helps provide a gradual transition in the channel voltage at the source end of the NAND string.

The WLn−1 memory cells may be weakly erased when WLn is erased but their data can be recovered using XOR operations.

FIG. 17B depicts a voltage in the channel of FIG. 17A. The channel will typically charge up close to the level of Verase if GIDL is generated for a sufficient period of time. The voltage at the source end is 0.5 V, for example. With Vcg=0.5 V for WLn, there is a large channel-to-gate voltage for the memory cells of WLn which erases them, e.g., by lowering their Vth.

FIG. 17C depicts the NAND string of FIG. 17A, showing voltages in an erase-verify operation consistent with FIG. 11E, step 1156 and FIG. 11F, step 1164. Vread pass, e.g., 8-10 V, is applied to SGS, WLDS, the source-side data word lines, the drain-side data word lines and WLDD. Vcelsrc is applied to WLn as the erase-verify voltage. For a selected sub-block, Vread pass is applied to the SGD transistors. For the unselected sub-blocks, 0 V is applied to the SGD transistors. Vbl can be set to Vblc+Vcelsrc, to pass Vcelsrc to the NAND string.

Figure 18A:
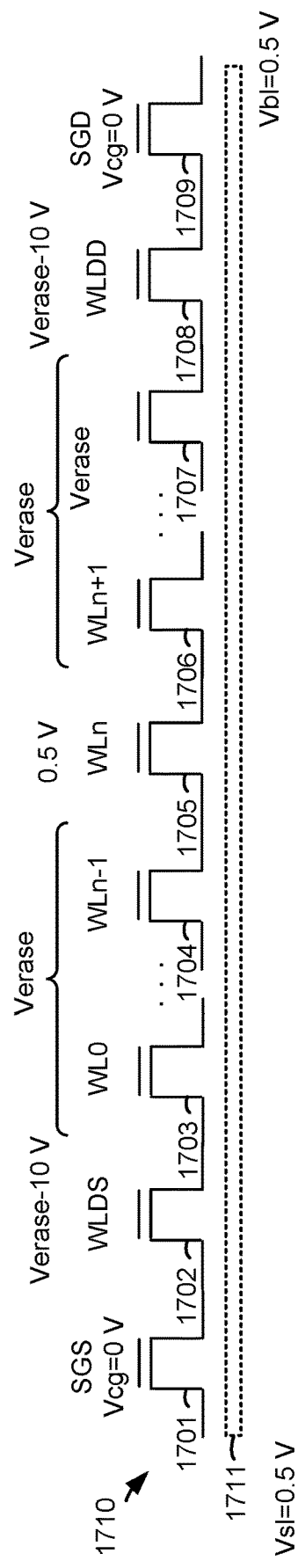
FIG. 18A depicts an example of a NAND string during an erase operation, consistent with FIG. 11F.

FIG. 18A depicts an example of a NAND string during an erase operation, consistent with FIG. 11F. This erase technique involves charging up the channels by creating channel gradients (plots 1811 and 1813 in FIG. 18B) adjacent to the short circuited word line, WLn. The SGS transistor is set in a non-conductive state by applying Vcg=0 V and Vsl=0.5 V, and the SGD transistor is set in the non-conductive state by applying Vcg=0 V and Vbl=0.5 V, so that the channel voltage floats and electrons cannot enter the channel from the bit line or source line. By applying a reduced voltage of Verase−10 V to the dummy word lines WLDS and WLDD, a gradual transition in the channel voltage is provided at the source and drain ends, respectively, of the NAND strings.

Figure 18B:
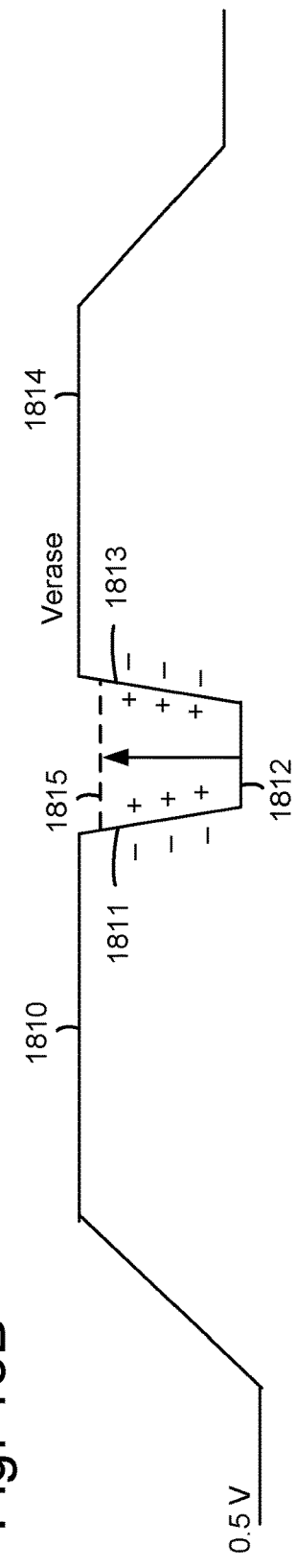
FIG. 18B depicts a voltage in the channel of FIG. 18A.

FIG. 18B depicts a voltage in the channel of FIG. 18A. When Verase is applied to the source-side data word lines WL0 to WLn−1 and to the drain-side data word lines WLn+1 to WL95, associated portions of the channel are capacitively coupled higher to a level similar to Verase (plots 1810 and 1814). However, with the low voltage on WLn, the associated portion of the channel will initially remain at a low level depicted by plot 1812. A channel gradient represented by plot 1811 is therefore created between WLn−1 and WLn, and a channel gradient represented by plot 1813 is created between WLn and WLn+1.

These channel gradients in a polysilicon channel generate electron-hole pairs, where the electrons are represented by "−" and the holes are represented by "+". The electrons are attracted to the high potential channel regions associated with the drain- and source-side word lines. The holes accumulate in, and charge up, the channel region associated with WLn, thus establishing an electric field across the WLn memory cells for hole injection. This condition is temporary since the low potential of the channel region associated with WLn is pulled up closer to the level of the larger channel regions associated with the drain- and source-side word lines, as depicted by plot 1815.

Figure 19:
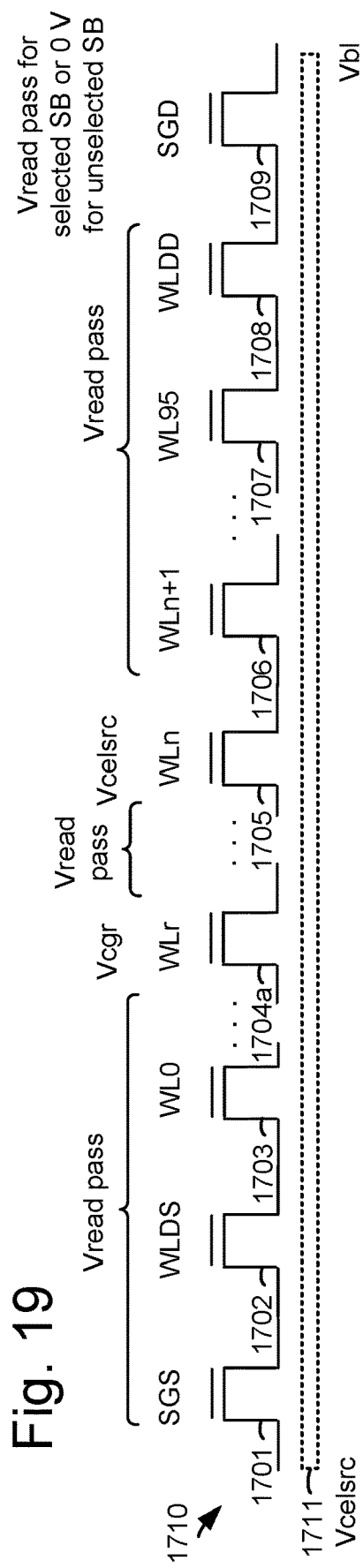
FIG. 19 depicts the NAND string of FIG. 17A, showing voltages in a recovery read operation consistent with FIG. 11G.

FIG. 19 depicts the NAND string of FIG. 17A, showing voltages in a recovery read operation consistent with FIG. 11G. A recovery word line WLr is depicted with an example memory cell 1704a. WLn denotes the word line with the short circuit. Vread pass is applied to SGSD, WLDS, WLDD and the data word lines other than WLr and WLn. Vcelsrc is applied to WLn as a pass voltage which is sufficiently high to set the WLn memory cells in a conductive state to allow sensing of the WLr memory cells. A control gate read voltage, Vcgr, is applied to WLr, such as in FIG. 14A. For a selected sub-block, Vread pass is applied to the SGD transistors. For the unselected sub-blocks, 0 V is applied to the SGD transistors.

Accordingly, it can be see that in one implementation, an apparatus comprises: a set of memory cells arranged in NAND strings in a block, each NAND string comprising a source end and a drain end, a source line connected to the source ends of the NAND strings; a plurality of word lines connected to the set of memory cells and comprising a selected word line; and a control circuit configured to: determine that a number of program loops used to program memory cells connected to the selected word line is below a threshold; in response to the determining that the number of the program loops is below the threshold, confirm that the plurality of word lines comprise a short circuited word line which is short circuited to the source line; in response to the confirming that the plurality of word lines comprise the short circuited word line, erasing memory cells connected to the short circuited word line until threshold voltages of the memory cells connected to the short circuited word line are below a first voltage; and read data from a word line programmed before the selected word line while applying the first voltage to the source line.

In another implementation, a method comprises: programming memory cells connected to a selected word line among a plurality of word lines, the plurality of word lines are connected to a set of memory cells in a block, the set of memory cells are arranged in NAND strings, and the NAND strings are connected to a source line; determining that a number of program loops used to program the memory cells connected to the selected word line is below a threshold; in response to the determining that the number of the program loops is below the threshold, identifying a short circuited word line among the plurality of word lines which is short circuited to the source line; erasing memory cells connected to the short circuited word line until threshold voltages of the memory cells connected to the short circuited word line are below a first voltage; and reading data from a word line programmed before the selected word line while applying the first voltage to the source line.

In another implementation, an apparatus comprises: a set of memory cells arranged in NAND strings in a block, each NAND string comprising a source end and a drain end, the source ends of the NAND strings are in contact with a source line; a plurality of word lines connected to the set of memory cells and comprising a selected word line; and a control circuit configured to: determine that an uncorrectable error exists when reading memory cells connected to the selected word line; and in response to the determining that the uncorrectable error exists, identify a short circuited word line among the plurality of word lines which is short circuited to the source line, wherein the identifying comprises counting a number of the NAND strings in a conductive state while a control gate voltage is applied to at least a subset of the plurality of word lines, and identifying one of the word lines of the at least the subset of the plurality of word lines for which the number of the NAND strings in the conductive state is above a threshold number.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings in a block, each NAND string comprising a source end and a drain end;
a source line connected to the source ends of the NAND strings;
a plurality of word lines connected to the set of memory cells and comprising a selected word line; and
a control circuit configured to:
determine that a number of program loops used to program memory cells connected to the selected word line is below a threshold;
in response to the determining that the number of the program loops is below the threshold, confirm that the plurality of word lines comprise a short circuited word line which is short circuited to the source line;
in response to the confirming that the plurality of word lines comprise the short circuited word line, erasing memory cells connected to the short circuited word line until threshold voltages of the memory cells connected to the short circuited word line are below a first voltage; and
read data from a word line programmed before the selected word line while applying the first voltage to the source line.

2. The apparatus of claim 1, wherein:
the NAND strings comprise dummy memory cells; and
to confirm that the plurality of word lines comprise the short circuited word line, the control circuit is configured to sense that threshold voltages of the dummy memory cells are above a second voltage.

3. The apparatus of claim 1, wherein:
each NAND string comprises a select gate transistor at the drain end; and
to confirm that the plurality of word lines comprise the short circuited word line, the control circuit is configured to sense that threshold voltages of the select gate transistors are above a second voltage.

4. The apparatus of claim 1, wherein:
to confirm that the plurality of word lines comprise the short circuited word line, the control circuit is configured to sense that threshold voltages of the memory cells connected to the selected word line are above a second voltage.

5. The apparatus of claim 1, wherein:
the NAND strings are arranged in a plurality of sub-blocks of the block;
the selected word line is programmed in a sub-block programming order; and
when the programmed memory cells are not in a first-programmed sub-block of the plurality of sub-blocks, the control circuit is configured to identify the selected word line as the short circuited word line.

6. The apparatus of claim 1, wherein:
the NAND strings are arranged in a plurality of sub-blocks of the block;
the selected word line is programmed in a sub-block programming order;
the plurality of word lines comprise an adjacent source-side word line of the selected word line which is programmed before the selected word line; and
when the programmed memory cells are in a first-programmed sub-block of the plurality of sub-blocks, the control circuit is configured to identify the adjacent source-side word line as the short circuited word line.

7. The apparatus of claim 1, wherein:
each NAND string comprises a channel and a select gate transistor; and
to erase the memory cells connected to the short circuited word line, the control circuit is configured to charge up the channels of the NAND strings by gate-induced drain leakage at the select gate transistors.

8. The apparatus of claim 7, wherein:
each NAND string comprises a channel and a select gate transistor; and
during the erase of the memory cells connected to the short circuited word line, the control circuit is configured to cutoff a portion of the channel adjacent to a source-side dummy word line.

9. The apparatus of claim 1, wherein:
each NAND string comprises a channel; and
to erase the memory cells connected to the short circuited word line, the control circuit is configured to charge up portions of the channels of the NAND strings which are adjacent to the short circuited word line by generating gradients in the channel adjacent to the short circuited word line.

10. The apparatus of claim 1, further comprising:
a conductive path extending vertically upward from the source line, wherein the short circuited word line is short circuited to the source line via the conductive path.

11. A method, comprising:
programming memory cells connected to a selected word line among a plurality of word lines, the plurality of word lines are connected to a set of memory cells in a block, the set of memory cells are arranged in NAND strings, and the NAND strings are connected to a source line;
determining that a number of program loops used to program the memory cells connected to the selected word line is below a threshold;
in response to the determining that the number of the program loops is below the threshold, identifying a short circuited word line among the plurality of word lines which is short circuited to the source line;
erasing memory cells connected to the short circuited word line until threshold voltages of the memory cells connected to the short circuited word line are below a first voltage; and
reading data from a word line programmed before the selected word line while applying the first voltage to the source line.

12. The method of claim 11, wherein the NAND strings comprise dummy memory cells, the method further comprising:
in response to the determining that the number of the program loops is below the threshold, sensing that threshold voltages of the dummy memory cells are above a second voltage, wherein the identifying of the short circuited word line is responsive to the sensing that the threshold voltages of the dummy memory cells are above the second voltage.

13. The method of claim 11, wherein the NAND strings comprise select gate transistors, the method further comprising:
in response to the determining that the number of the program loops is below the threshold, sensing that threshold voltages of the select gate transistors are above a second voltage, wherein the identifying of the short circuited word line is responsive to the sensing that the threshold voltages of the select gate transistor are above the second voltage.

14. The method of claim 11, wherein:
the erasing of the memory cells connected to the short circuited word line occurs without erasing memory cells connected to remaining word lines of the plurality of word lines.

15. The method of claim 11, wherein:
the erasing of the memory cells connected to the short circuited word line comprises performing a verify test which determines whether threshold voltages of the memory cells connected to the short circuited word line are below the first voltage.

16. An apparatus, comprising:
a set of memory cells arranged in NAND strings in a block, each NAND string comprising a source end and a drain end, the source ends of the NAND strings are in contact with a source line;
a plurality of word lines connected to the set of memory cells and comprising a selected word line; and
a control circuit configured to:
determine that an uncorrectable error exists when reading memory cells connected to the selected word line; and
in response to the determining that the uncorrectable error exists, identify a short circuited word line among the plurality of word lines which is short circuited to the source line, wherein the identifying comprises counting a number of the NAND strings in a conductive state while a control gate voltage is applied to at least a subset of the plurality of word lines, and identifying one of the word lines of the at least the subset of the plurality of word lines for which the number of the NAND strings in the conductive state is above a threshold number.

17. The apparatus of claim 16, wherein:
the counting of the number of the NAND strings in the conductive state occurs for each word line of the at least the subset of the plurality of word lines.

18. The apparatus of claim 16, wherein:
the counting of the number of the NAND strings in the conductive state occurs for sets of multiple word lines of the at least the subset of the plurality of word lines until one of the sets is identified for which the number of the NAND strings in the conductive state is above the threshold number, after which the counting of the number of the NAND strings in the conductive state occurs for each word line of the one of the sets.

19. The apparatus of claim 16, wherein:
while the control gate voltage is applied to a word line of the at least the subset of the plurality of word lines, the control circuit is configured to apply a pass voltage to remaining word lines of the plurality of word lines to which the control gate voltage is not applied.

20. The apparatus of claim 16, wherein:
in response to the identifying of the short circuited word line, the control circuit is configured to erase the short circuited word line and subsequently recover data from another word line of the block which was programmed before the short circuited word line.

* * * * *